(12) United States Patent
Lee et al.

(10) Patent No.: US 12,080,208 B2
(45) Date of Patent: Sep. 3, 2024

(54) DISPLAY DEVICE AND METHOD FOR CONTROLLING THE SAME

(71) Applicant: LG ELECTRONICS INC., Seoul (KR)

(72) Inventors: Sanghee Lee, Seoul (KR); Yuri Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 17/812,420

(22) Filed: Jul. 13, 2022

(65) Prior Publication Data
US 2023/0222949 A1 Jul. 13, 2023

(30) Foreign Application Priority Data

Jan. 13, 2022 (KR) .................. 10-2022-0005155

(51) Int. Cl.
*G09G 3/00* (2006.01)
*G09G 3/20* (2006.01)
*H05K 5/02* (2006.01)

(52) U.S. Cl.
CPC .......... *G09G 3/035* (2020.08); *G09G 3/2092* (2013.01); *H05K 5/0217* (2013.01); *G09G 2340/0464* (2013.01); *G09G 2354/00* (2013.01)

(58) Field of Classification Search
CPC .... G06F 3/147; G09G 5/003; G09G 2340/12; G09G 2320/08; G09G 3/00; G09F 9/301
See application file for complete search history.

(56) References Cited

U.S. PATENT DOCUMENTS

| | | | |
|---|---|---|---|
| 9,058,758 B2 * | 6/2015 | Shin | G06F 1/1601 |
| 9,116,662 B1 * | 8/2015 | Song | G06F 1/1601 |
| 9,142,162 B2 * | 9/2015 | Kwack | G06F 3/0412 |

(Continued)

FOREIGN PATENT DOCUMENTS

| | | |
|---|---|---|
| EP | 3016098 | 5/2016 |
| EP | 3249640 | 11/2017 |

(Continued)

OTHER PUBLICATIONS

European Patent Office Application Serial No. 22168496.2, Search Report dated Sep. 22, 2022, 19 pages.

(Continued)

*Primary Examiner* — Olga V Merkoulova
(74) *Attorney, Agent, or Firm* — LEE, HONG, DEGERMAN, KANG & WAIMEY

(57) ABSTRACT

A display device includes a main body configured to have a display module to which a user interface is output, a bending module located at a center of a back surface of the main body, and a controller. The controller controls the bending module to change a curvature of the display module to any one of a flat mode in which the display module is flat, a first bending mode in which the display module has a first curvature, and a second bending mode in which the display module has a second curvature, wherein the second curvature is a maximum curvature of the display module. Then, the controller changes at least one of a size and a position of a display region to which the user interface is output, according to whether a mode is the flat mode, the first bending mode, or the second bending mode.

10 Claims, 21 Drawing Sheets

(56) References Cited

U.S. PATENT DOCUMENTS

| | | | | |
|---|---|---|---|---|
| 9,177,501 | B2* | 11/2015 | Moriwaki | G09G 3/3208 |
| 9,448,660 | B2* | 9/2016 | Seo | G06F 3/0486 |
| 9,639,177 | B2* | 5/2017 | Kim | G06F 3/1431 |
| 10,111,349 | B2* | 10/2018 | Xu | H05K 5/0017 |
| 11,068,074 | B2* | 7/2021 | Lee | H04M 1/0243 |
| 11,393,367 | B2* | 7/2022 | Kim | G06F 3/04886 |
| 2012/0224311 | A1* | 9/2012 | Sutherland | G09F 9/372 |
| | | | | 361/679.01 |
| 2013/0114193 | A1* | 5/2013 | Joo | F16M 11/22 |
| | | | | 361/679.01 |
| 2013/0329422 | A1* | 12/2013 | Park | F21V 23/0471 |
| | | | | 362/233 |
| 2014/0015743 | A1* | 1/2014 | Seo | G06F 3/017 |
| | | | | 345/156 |
| 2014/0062976 | A1* | 3/2014 | Park | G06F 1/1652 |
| | | | | 345/204 |
| 2014/0267097 | A1* | 9/2014 | Lee | G06F 3/0416 |
| | | | | 361/679.01 |
| 2014/0354791 | A1* | 12/2014 | Lee | G06F 3/165 |
| | | | | 348/739 |
| 2014/0376163 | A1* | 12/2014 | Song | G09F 9/301 |
| | | | | 361/679.01 |
| 2015/0035812 | A1* | 2/2015 | Shin | G06F 1/1601 |
| | | | | 345/204 |
| 2015/0049090 | A1* | 2/2015 | Kim | G06T 11/203 |
| | | | | 345/442 |
| 2015/0309611 | A1* | 10/2015 | Vertegaal | G06Q 30/0209 |
| | | | | 345/174 |
| 2015/0331273 | A1 | 11/2015 | Yu et al. | |
| 2016/0034047 | A1* | 2/2016 | Lee | H04M 1/72427 |
| | | | | 345/156 |
| 2016/0127674 | A1* | 5/2016 | Kim | H04N 21/42204 |
| | | | | 348/739 |
| 2016/0191837 | A1 | 6/2016 | Huh et al. | |
| 2016/0252236 | A1 | 9/2016 | Chen et al. | |
| 2020/0097157 | A1* | 3/2020 | Bandishti | G06F 3/04845 |

FOREIGN PATENT DOCUMENTS

| | | |
|---|---|---|
| KR | 1020160004562 | 1/2016 |
| WO | 2020133394 | 7/2020 |

OTHER PUBLICATIONS

European Patent Office Application Serial No. 22168496.2, Search Report dated Dec. 21, 2022, 18 pages.

Japan Patent Office Application No. 2022-085174, Office Action dated Jul. 25, 2023, 3 pages.

* cited by examiner

FIG. 2
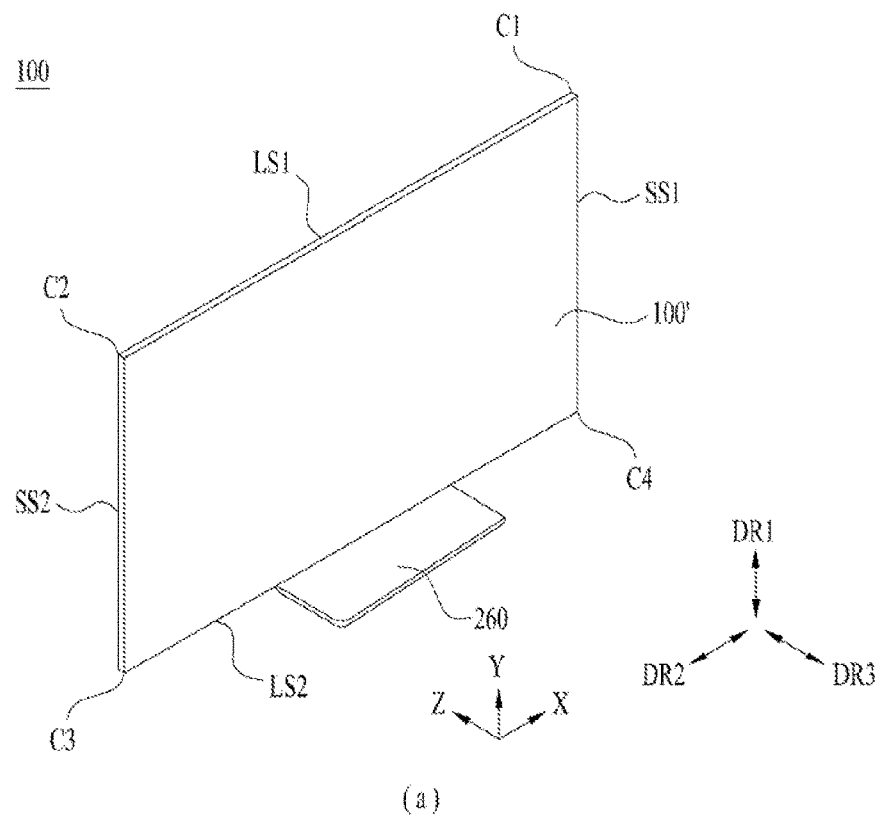
(a)
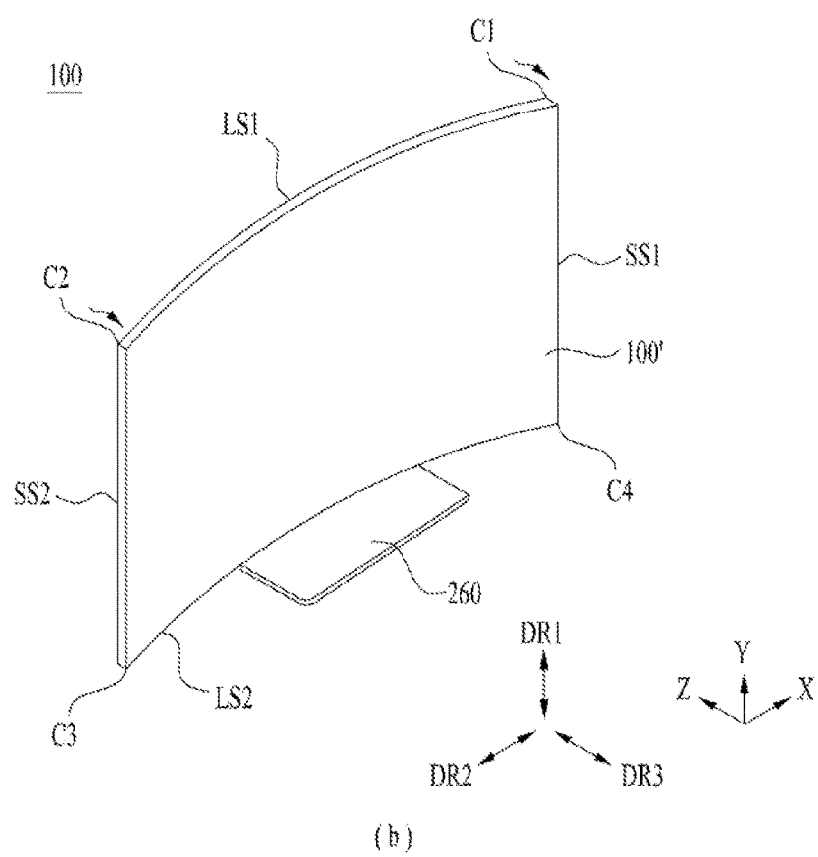
(b)

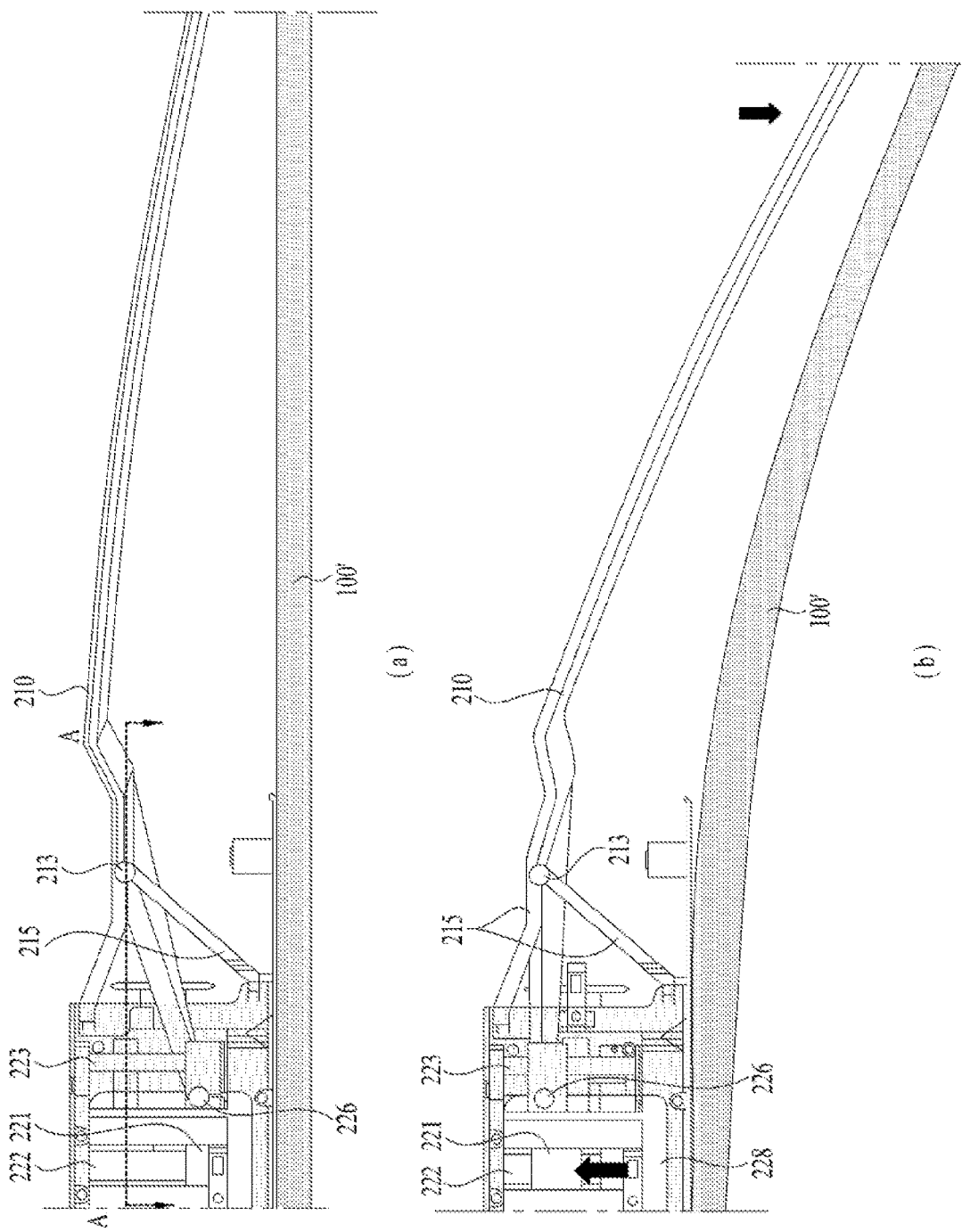

FIG. 6a
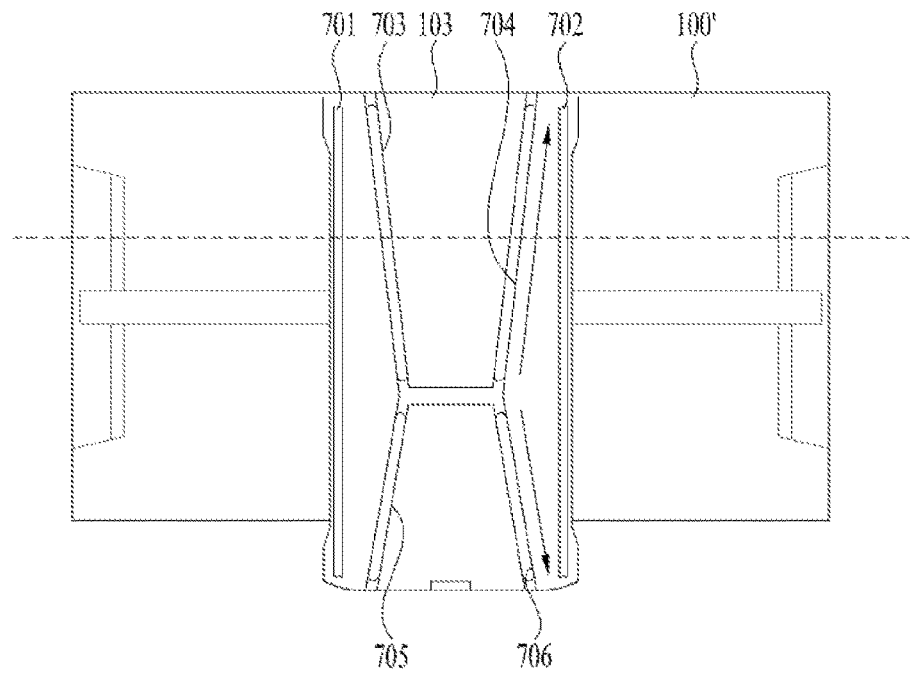
(a)
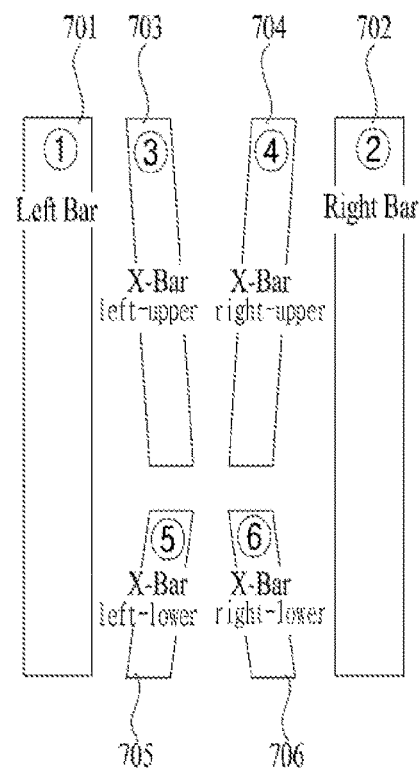
(b)

FIG. 6b
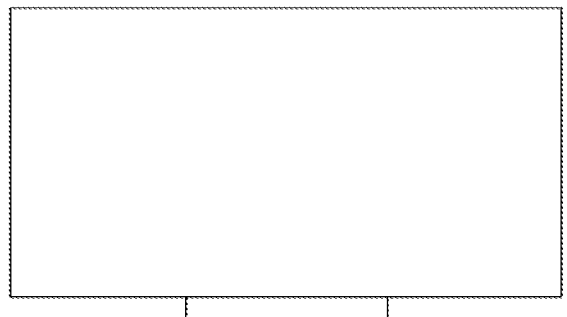
(a) Front View
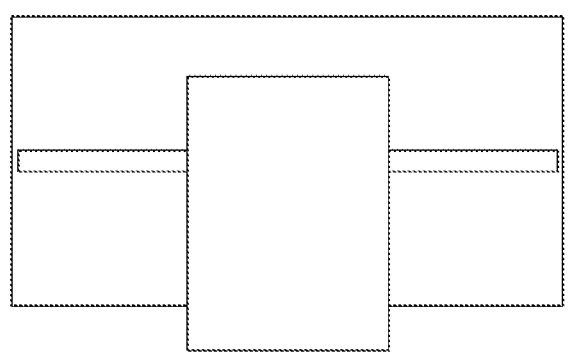
(b) Back view
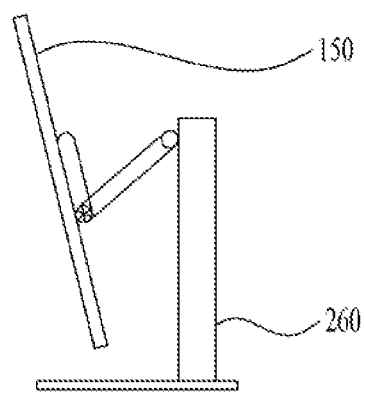
(c) Side View
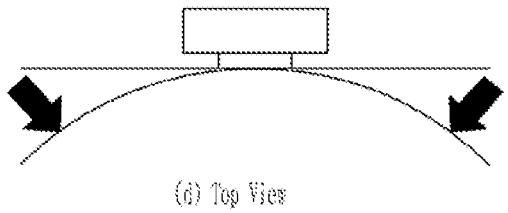
(d) Top View

DISPLAY DEVICE AND METHOD FOR CONTROLLING THE SAME

CROSS REFERENCE TO RELATED APPLICATION(S)

Pursuant to 35 U.S.C. § 119(a), this application claims the benefit of earlier filing date and right of priority to Korean Patent Application No. 10-2022-0005155, filed on Jan. 13, 2022, the contents of which are hereby incorporated by reference herein in its entirety.

BACKGROUND OF THE INVENTION

Field of the Invention

The present disclosure relates to a display device having a curved surface structure capable of improving the degree of immersion of a user who views the display device.

Discussion of the Related Art

With the increasing development of information society, the demand for display devices is also increasing in various forms. In response to this trend, various display devices, for example, Liquid Crystal Display (LCD), Field Emission Display (FED), Plasma Display Panel (PDP), an electroluminescent device, etc. have recently been developed.

A liquid crystal panel of the LCD may include a liquid crystal layer, may further include a thin film transistor (TFT) substrate and a color filter substrate that are arranged to face each other on the basis of the liquid crystal panel interposed therebetween, and may display an image using light provided from a backlight unit.

As an example of an electroluminescent device, active-matrix-type organic light emitting display (OLED) devices are commercially available on the market and widely used throughout the world. Since the OLED device is a self-emitting device, the OLED device has no backlight and is advantageous in terms of a response speed and a viewing angle as compared to the LCD, so that the OLED devices are attracting attention as next-generation displays.

As described above, since the OLED device has no backlight, the OLED device can be bent and deformed in shape, resulting in implementation of a curved display module. However, as the display module has the curved display module, a user interface being output through the display module also needs to be changed.

SUMMARY OF THE INVENTION

Accordingly, the present disclosure is directed to a display device and a method for controlling the same that substantially obviate one or more problems due to limitations and disadvantages of the related art.

An object of the present disclosure is to provide a display device capable of changing an output user interface based on a curvature.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a display device includes a main body configured to have a display module to which a user interface is output; a bending module located at a center of a back surface of the main body; and a controller, wherein the controller controls the bending module to change a curvature of the display module to any one of a flat mode in which the display module is flat, a first bending mode in which the display module has a first curvature, and a second bending mode in which the display module has a second curvature, wherein the second curvature is a maximum curvature of the display module, and changing at least one of a size and a position of a display region to which the user interface is output, according to whether a mode is the flat mode, the first bending mode, or the second bending mode.

When the display module is in the flat mode, the controller may output the user interface to a first region of the display module. When the display module is in the second bending module, the controller may output the user interface to a second region of the display module, wherein the second region is smaller in size than the first region.

The controller may adjust a size of the user interface based on sizes of the first region and the second region.

When the user interface includes a plurality of items, the controller may set a spacing between the plurality of items in the first region to a first spacing, and may output the plurality of items spaced apart from each other by the first spacing to the first region; and the controller may set a spacing between the plurality of items in the second region to a second spacing, and may output the plurality of items spaced apart from each other by the second spacing to the second region, wherein the second spacing is smaller in width than the first spacing.

When the plurality of items is output to the second region, the controller may enable the plurality of items to be output in a centralized arrangement format.

When the plurality of items is output to the second region, the controller may enable the plurality of items to be output in a fan-shaped arrangement format.

The controller may include receiving a control signal from a remote controller, and selecting a first item from among the plurality of items based on the received control signal.

The controller may further include, upon receiving a selection signal for selecting an UP button from the remote controller, selecting a second item from among the plurality of items arranged in the fan-shaped arrangement format, wherein the second item is located at the most central position or the uppermost position of the fan-shaped arrangement format.

The display device may further include: one pair of links having one end coupled to the bending module, and extending in a horizontal direction; and a link bracket disposed at left and right ends of the main body and connected to the other end of the links, wherein the bending module includes: a guide shaft extending from the back surface of the main body; and a moving block inserted into the guide shaft and configured to move forward and backward, wherein, when the moving block moves forward and backward along the guide shaft, an angle between the links is changed and the curvature of the display module is also changed.

In accordance with another embodiment of the present disclosure, a method for controlling a display device which includes a main body having a display module to which an image is output, and a bending module located at a center of a back surface of the main body may include outputting a user interface image through the display module of the display device; controlling the bending module to change a curvature of the display module to any one of a flat mode in which the display module is flat, a first bending mode in which the display module has a first curvature, and a second bending mode in which the display module has a second curvature, wherein the second curvature is a maximum curvature of the display module; and changing at least one of a size and a position of a display region to which the user interface is output, according to whether a mode is the flat mode, the first bending mode, or the second bending mode.

It is to be understood that both the foregoing general description and the following detailed description of the present disclosure are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 2 is a perspective view illustrating an example of a display device according to an embodiment of the present disclosure.

FIG. 5 is a top view illustrating a display device according to an embodiment of the present disclosure.

FIG. 6A is a diagram illustrating a light structure of a display device according to an exemplary embodiment of the present disclosure.

FIG. 6B is a diagram illustrating a display device when viewed from various directions according to an exemplary embodiment of the present disclosure.

DESCRIPTION OF SPECIFIC EMBODIMENTS

Figure 1:
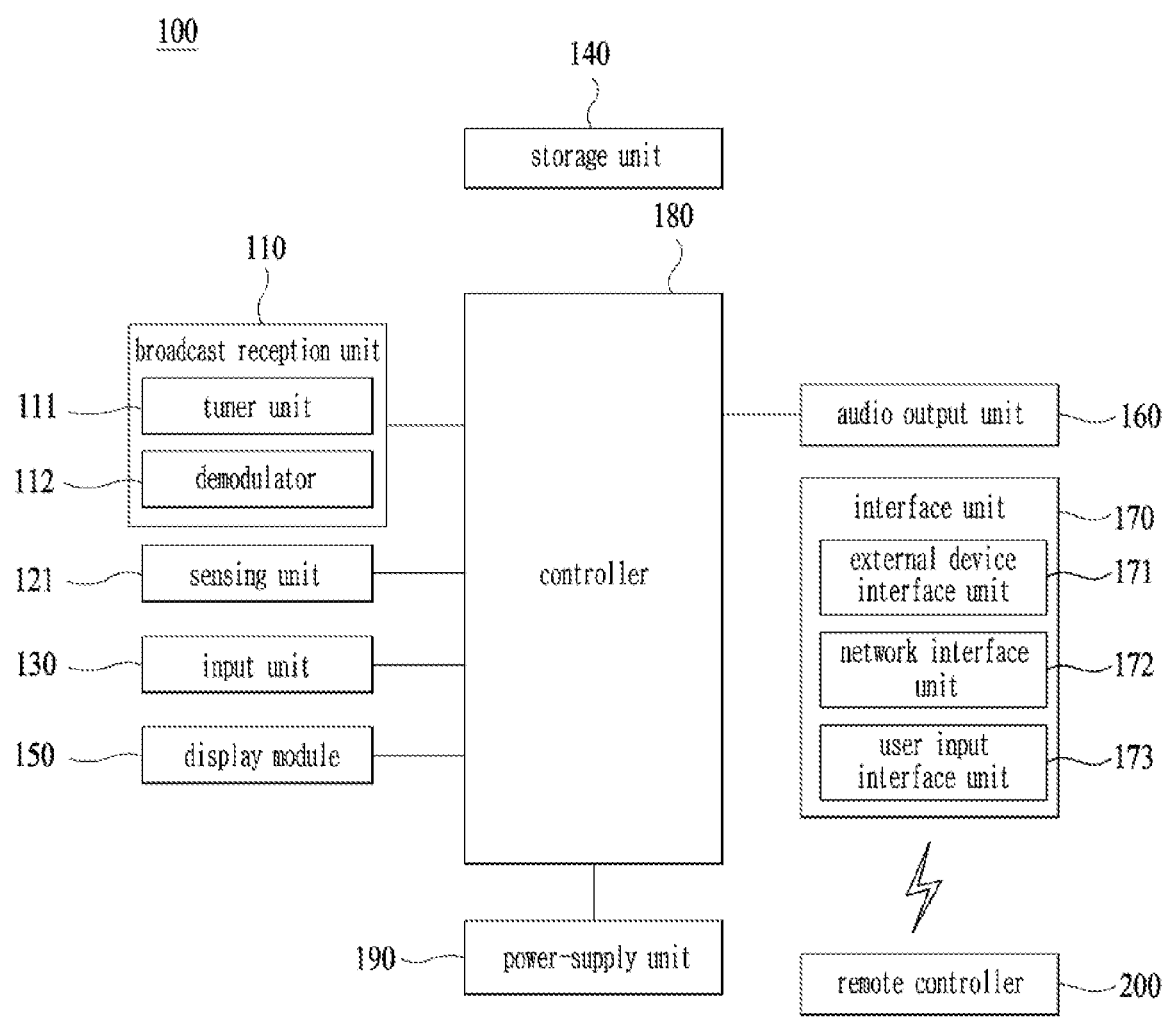
FIG. 1 is a block diagram illustrating constituent elements of a display device according to an embodiment of the present disclosure.

Description will now be given in detail according to exemplary embodiments disclosed herein, with reference to the accompanying drawings. For the sake of brief description with reference to the drawings, the same or equivalent components may be provided with the same reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be directly connected with the other element or intervening elements may also be present. In contrast, when an element is referred to as being "directly connected with" another element, there are no intervening elements present.

A singular representation may include a plural representation unless it represents a definitely different meaning from the context.

Terms such as "include" or "has" are used herein and should be understood that they are intended to indicate an existence of several components, functions or steps, disclosed in the specification, and it is also understood that greater or fewer components, functions, or steps may likewise be utilized.

On the other hand, the image display device described herein is, for example, an intelligent image display device implemented by adding a computer support function to a broadcast reception function, and further includes an Internet function or the like while sufficiently performing the broadcast reception function, so that the image display device may have user-friendly interfaces such as a handwriting input device, a touchscreen, or a spatial remote controller. Further, the image display device can support a wired or wireless Internet function by connecting to the Internet and a computer device, thereby performing e-mailing, web browsing, banking, or gaming. To implement these functions, the image display device may operate based on a standard general-purpose Operating System (OS).

Accordingly, the image display device according to the present disclosure is designed in a manner that various applications can be easily added to or deleted from a general-purpose OS kernel so that the image display device can perform various user-friendly functions. The image display device may be, for example, a network TV, a Hybrid broadcast broadband TV (HBBTV), a smart TV, etc. The image display device is applicable to a smartphone as needed.

FIG. 1 is a block diagram illustrating constituent elements of a display device 100 according to an embodiment of the present disclosure.

Referring to FIG. 1, the display device 100 may include a broadcast reception unit 110, an external device interface unit 171, a network interface unit 172, a storage unit 140, a user input interface unit 173, an input unit 130, a controller 180, a display 150, an audio output unit 160, and/or a power-supply unit 190.

The broadcast reception unit 110 may include a tuner unit 111 and a demodulator 112.

Although not shown in the drawings, the display device 100 may include only the external device interface unit 171 and the network interface unit 172 from among the broadcast reception unit 110, the external device interface unit 171, and the network interface unit 172. That is, the display device 100 may not include the broadcast reception unit 110.

The tuner unit 111 may select a broadcast signal corresponding to either a user-selected channel or all prestored channels from among broadcast signals received through an antenna (not shown) or a cable (not shown). The tuner unit 111 may convert the selected broadcast signal into an intermediate frequency (IF) signal or a baseband image or a voice signal.

For example, when the selected broadcast signal is a digital broadcast signal, the tuner unit 111 may convert the selected broadcast signal into a digital IF (DIF) signal. When the selected broadcast signal is an analog broadcast signal, the tuner unit 111 may convert the selected broadcast signal into an analog baseband image or a voice signal (CVBS/SIF). That is, the tuner unit 111 may process the digital broadcast signal or the analog broadcast signal. The analog baseband image or the voice signal (CVBS/SIF) output from the tuner unit 111 may be directly input to the controller 180.

The tuner unit 111 may sequentially select broadcasting signals of all broadcasting channels stored through a channel memory function from among the received broadcast signals, and may convert the selected broadcast signal into an intermediate frequency (IF) signal or a baseband image or a voice signal.

The tuner unit 111 may include a plurality of tuners to receive broadcast signals of the plurality of channels. Alternatively, a single tuner for simultaneously receiving broadcast signals of the plurality of channels is also possible.

The demodulator 112 may receive the digital IF signal (DIF) converted by the tuner unit 111, and may thus perform demodulation of the received signal. The demodulator 112 may perform demodulation and channel decoding, and may output a stream signal (TS). The stream signal may be a signal formed by multiplexing an image signal, a voice signal, or a data signal.

The stream signal (TS) output from the demodulator 112 may be input tio the controller 180. The controller 180 may perform demultiplexing, image/audio signal processing, etc., may output an image through the display 150, and may output a voice through the audio output unit 160.

The sensing unit 120 may sense a change in the display device 100 or may sense an external change. For example, the sensing unit 120 may include a proximity sensor, an illumination sensor, a touch sensor, an infrared (IR) sensor, an ultrasonic sensor, an optical sensor (e.g., a camera), a voice sensor (e.g., a microphone), a battery gauge, environmental sensors (e.g., hygrometer, a thermometer, etc.).

The controller 180 may check a state of the display device 100 based on information collected by the sensing unit 120, may notify the user of a problem, or may control the display device 100 to be kept in the best state.

In addition, it is possible to provide an optimal viewing environment by differently controlling the content, image quality, size, etc. of the image provided to the display module 180 depending on the viewer, ambient illuminance, etc. sensed by the sensing unit. As the smart TV has evolved, the number of functions mounted in the display device increases, and the number of the sensing units 20 also increases together with the increasing functions.

The input unit 130 may be provided at one side of a main body of the display device 100. For example, the input unit 130 may include a touch pad, a physical button, and the like. The input unit 130 may receive various user commands related to the operation of the display device 100, and may transmit a control signal corresponding to the input command to the controller 180.

Recently, as a bezel of the display device 100 decreases in size, the number of display devices 100 each including a minimum number of input unit 130 formed in a physical button exposed to the outside is rapidly increasing. Instead, a minimum number of physical buttons may be provided on the back or side surface of the display device 100. The display device may receive a user input through the remote controller 200 through a touchpad or a user input interface unit 173 to be described later.

The storage unit 140 may store a program for processing and controlling each signal used in the controller 180, and may store a signal-processed image, a voice, or a data signal. For example, the storage unit 140 may store application programs designed for the purpose of performing various tasks that can be processed by the controller 180, and may selectively provide some of the stored application programs upon request of the controller 180.

The program stored in the storage unit 140 is not specifically limited to being executed by the controller 180. The storage unit 140 may perform a function for temporarily storing an image, a voice, or a data signal received from an external device through the external device interface unit 171. The storage unit 140 may store information about a predetermined broadcast channel through a channel memory function such as a channel map.

Although the storage unit 140 of FIG. 1 is provided separately from the controller 180, the scope of the present disclosure is not limited thereto, and the storage unit 140 may also be included in the controller 180 as needed.

The storage unit 140 may include at least one of a volatile memory (e.g., DRAM, SRAM, SDRAM, etc.) and a non-volatile memory (e.g., flash memory, hard disk drive (HDD), solid state drive (SSD), etc.).

The display 150 may generate a drive signal by converting an image signal, a data signal, an OSD signal, a control signal processed by the controller 180, or by converting an image signal, a data signal, a control signal, etc. received from the interface unit 171. The display 150 may include a display panel 181 having a plurality of pixels.

A plurality of pixels included in the display panel may include RGB sub-pixels. Alternatively, a plurality of pixels included in the display panel may include sub-pixels of RGBW. The display 150 may convert the image signal, the data signal, the OSD signal, the control signal, etc. processed by the controller 180 to generate a drive signal for the plurality of pixels.

The display 150 may be implemented as a plasma display panel (PDP), a liquid crystal display (LCD), an organic light emitting diode (OLED), a flexible display, etc. In addition, the display 150 may also be implemented as a three-dimensional (3D) display. The three-dimensional (3D) display 150 may be classified into a glassless-type 3D display and a glasses-type 3D display.

The display device may include a display module that occupies most parts of the front surface, and a case that covers the back and side surfaces of the display module and packages the display module.

Recently, the display device 100 has evolved from a flat-screen display to a curved-screen display. In order to implement the curved screen, the display device 100 may use a display module 150 that can be bent or curved, such as a light emitting diode (LED) or an organic light emitting diode (OLED), etc.

Conventionally, the LCD has difficulty in self-emitting light, so that the conventional LCD has been designed to receive light through a backlight unit. The backlight unit is a device for uniformly supplying light received from a light source to a liquid crystal located on the front surface of the display device. As the backlight becomes thinner, a thin LCD can be implemented. However, it is actually difficult for the backlight unit to be implemented as a curved structure formed of a flexible material. Although the backlight unit is implemented as a curved shape, it is difficult for light to be uniformly applied to the liquid crystal, thereby changing brightness of the screen.

On the other hand, the LED or the OLED is designed in a manner that each of constituent elements constructing the pixels can self-emit light without using the backlight unit, so that the LED or the OLED can be implemented as a curved shape without any problems. In addition, since each element can perform self-emission of light, brightness of each element is not affected by a change in the positional relationship between the element and adjacent elements, so that a curved display module 150 can be implemented as an LED or OLED.

OLED (Organic Light Emitting Diode) panels appeared in earnest in mid-2010 and are rapidly replacing LCDs in the small- and medium-sized display market. The OLED is a display made using the self-emission characteristics in which OLED emits light when a current flows in a fluorescent organic compound. Since the response speed of the OLED is faster than that of the LCD, there is little afterimage when moving images are implemented.

OLEDs may be used as a light-emitting display product. In this case, the light-emitting display device may use three fluorescent organic compounds (such as red, green, and blue) each having a self-emitting function, and may use the self-emitting phenomenon in which positive(+)-charged particles and electrons injected from a cathode and anode are combined with each other within the organic material, so that a backlight unit causing degradation of color sense need not be used.

The LED panel is implemented by technology for using only one LED element as one pixel, and has a smaller LED element compared to the prior art, so that a curved display module 150 can be implemented. Whereas the conventional device referred to as an LED TV can use the LED as a light source of the backlight unit for supplying light to the LCD, it is impossible for the LED of the conventional device to constitute a screen.

The display module may include a display panel, a coupling magnet located on the rear surface of the display panel, a first power-supply unit, and a first signal module. The display panel may include a plurality of pixels (R, G, B). The plurality of pixels (R, G, B) may be formed in each region where a plurality of data lines and a plurality of gate lines cross each other. The plurality of pixels (R, G, B) may be arranged in a matrix.

For example, the plurality of pixels (R, G, B) may include a red(R) sub-pixel, a green(G) sub-pixel, and a blue(B) sub-pixel. The plurality of pixels (R, G, B) may further include white (W) sub-pixel(s).

In the display module 150, one side where an image is displayed may be referred to as a front side or a front surface. When the display module 150 displays an image, one side where no image is observed may be referred to as a rear side or a rear surface.

Meanwhile, the display 150 may be implemented as a touchscreen, so that the display 150 can also be used as an input device in addition to an output device.

The audio output unit 160 may receive a voice-processed signal from the controller 180, and may output the received signal as a voice signal.

The interface unit 170 may serve as a path of connection to various kinds of external devices connected to the display device 100. The interface unit may include not only a wired method for transmitting/receiving data through a cable, but also a wireless method using the antenna.

The interface unit 170 may include at least one of a wired/wireless headset port, an external charger port, a wired/wireless data port, a memory card port, a port connected to a device having an identification module, an audio input/output (I/O) port, a video I/O port, and an earphone port.

As an example of a wireless method, the above-described broadcast reception unit 110 may be used. The broadcast reception unit 110 may be configured to use a broadcast signal, a mobile communication short-range communication signal, a wireless Internet signal, and the like.

The external device interface unit 171 may transmit or receive data to and from a connected external device. To this end, the external device interface unit 171 may include an A/V input/output (I/O) unit (not shown).

The external device interface unit 171 may be wired or wirelessly connected to an external device such as a digital versatile disc (DVD) player, a Blu-ray player, a game console, a camera, a camcorder, a computer (laptop), a set-top box, or the like, and may perform an input/output (I/O) operation with the external device.

In addition, the external device interface unit 171 may establish a communication network with various remote controllers 200, may receive a control signal related to operation of the display device 100 from the remote controller 200, or may transmit data related to operation of the display device 100 to the remote controller 200.

The external device interface unit 171 may include a wireless communication unit (not shown) for short-range wireless communication with other electronic devices. Through the wireless communication unit (not shown), the external device interface unit 171 may exchange data with an adjacent mobile terminal. In particular, the external device interface unit 171 may receive device information, application information, an application image, and the like from the mobile terminal in a mirroring mode.

The network interface unit 172 may provide an interface for connecting the display device 100 to a wired/wireless network including the Internet network. For example, the network interface unit 172 may receive content or data provided by the Internet, a content provider, or a network administrator through a network. The network interface unit 172 may include a communication module (not shown) for connection with the wired/wireless network.

The external device interface unit 171 and/or the network interface unit 172 may include a communication module for short-range communication such as Wi-Fi, Bluetooth, Bluetooth low energy (BLE), ZigBee, Near Field Communication (NFC), and a communication module for cellular communication such as Long-Term Evolution (LTE), LTE-A (LTE Advanced), Code Division Multiple Access (CDMA), WCDMA(wideband CDMA), UMTS(universal mobile telecommunications system), WiBro(Wireless Broadband), etc.

The user input interface unit 173 may transmit user input signals to the controller 180, or may transmit signals received from the controller 180 to the user. For example, the user input interface unit 173 may transmit or receive user input signals (such as a power-on/off signal, a channel selection signal, and a screen setting signal) to and from the remote controller 200, may transmit user input signals received through a local key (not shown) such as a power key, a channel key, a volume key, and a setting key to the controller 180, may transmit a user input signal received by a sensor unit (not shown) for sensing a user gesture to the controller 180, or may transmit a signal received from the controller 180 to the sensor unit.

The controller 180 may include at least one processor, and may control the overall operation of the display device 100 using the processor included therein. Here, the processor may be a general processor such as a CPU. Of course, the processor may be a dedicated device such as an ASIC, or other hardware-based processor.

The controller 180 may demultiplex the stream received through the tuner unit 111, the demodulator 112, the external device interface unit 171, or the network interface 172, and may process the demultiplexed signals to generate and output a signal for image or voice output.

The image signal processed by the controller 180 may be input to the display 150 and displayed as an image corresponding to the corresponding image signal. In addition, the image signal processed by the controller 180 may be input to the external output device through the external device interface unit 171.

The voice (or audio) signal processed by the controller 180 may be audibly output to the audio output unit 160. In addition, the voice signal processed by the controller 180 may be input to the external output device through the external device interface unit 171. Although not shown in FIG. 2, the controller 180 may include a demultiplexer, an image processor, and the like, and a detailed description thereof will hereinafter be described with reference to FIG. 3.

In addition, the controller 180 may control the overall operation of the display device 100. For example, the controller 180 may control the tuner unit 111 to select a broadcast program corresponding to either a user-selected channel or a prestored channel.

In addition, the controller 180 may control the display device 100 by a user command or an internal program received through the user input interface unit 173. The controller 180 may control the display 150 to display an image. In this case, the image displayed on the display 150 may be a still image or a moving image, and may be a 2D image or a 3D image.

On the other hand, the controller 180 may display a predetermined 2D object in the image displayed on the display 150. For example, the object may be at least one of a connected web screen (newspaper, magazine, etc.), electronic program guide (EPG), various menus, widgets, icons, still images, moving images, and text.

Meanwhile, the controller 180 may modulate and/or demodulate the signal using an amplitude shift keying (ASK) scheme. Here, the ASK scheme may refer to a method for modulating a signal by differentiating the amplitude of a carrier wave according to data values or for restoring an analog signal to a digital data value according to the amplitude of the carrier wave.

For example, the controller 180 may modulate an image signal using the ASK scheme, and may transmit the modulated signal through a wireless communication module.

For example, the controller 180 may demodulate and process the image signal received through the wireless communication module using the ASK scheme.

Accordingly, the display device 100 may simply transmit and receive signals to and from other image display devices arranged adjacent to each other without using either a unique identifier such as a Media Access Control (MAC) address or a complex communication protocol such as TCP/IP.

On the other hand, the display device 100 may further include a photographing unit (not shown). The photographing unit may photograph a user. The photographing unit may be implemented as one camera, but is not limited thereto, and may be implemented by a plurality of cameras. On the other hand, the photographing unit may be embedded in the display device 100 or may be separately arranged on the display 150. The image information photographed by the photographing unit may be input to the controller 180.

The controller 180 may recognize the position of the user based on the image photographed by the photographing unit. For example, the controller 180 may recognize a distance (z-axis coordinates) between the user and the display device 100. In addition, the controller 180 may recognize the X-axis coordinate and the Y-axis coordinate within the display 150 corresponding to the user position.

The controller 180 may sense a user gesture based on an image photographed by the photographing unit, each of signals detected by the sensor unit, or a combination thereof.

The power-supply unit 190 may supply corresponding power to the display device 100. In particular, the controller 180 may be implemented as a System on Chip (SoC), a display 150 for displaying an image, and an audio output unit 160 for audio output.

Specifically, the power-supply unit 190 may include a converter (not shown) for converting AC power into DC power, and a DC/DC converter (not shown) for converting the level of DC power.

On the other hand, the power-supply unit 190 may receive power from the external power source, and may distribute the received power to the respective components. The power-supply unit 190 may be directly connected to the external power source to supply AC power, and may include a battery capable of being charged with electricity.

In the former case, the power-supply unit 190 may be used by connecting to a wired cable, and it is difficult for the power-supply unit 190 to move from one place to another place, and the movement range of the power-supply unit 190 is limited. In the latter case, the power-supply unit 190 can move from one place to another place, but the weight and volume of the power-supply unit 190 may increase as much as the weight and volume of the battery. In addition, for charging, the power-supply unit 190 should be directly connected to a power cable for a predetermined period of time or should be coupled to a charging cradle (not shown) for power supply.

The charging cradle may be connected to the display device through a terminal exposed to the outside. Alternatively, if the power-supply unit 190 approaches the charging cradle using a wireless interface, a built-in battery of the power-supply unit 190 may also be charged with electricity.

The remote controller 200 may transmit a user input to the user input interface unit 173. To this end, the remote controller 200 may use Bluetooth, Radio Frequency (RF) communication, infrared (IR) communication, Ultra-Wideband (UWB), ZigBee, or the like. In addition, the remote controller 200 may receive the image, voice, or data signal output from the user input interface unit 173, and may display or audibly output the received image, voice, or data signal.

On the other hand, the above-described display device 100 may be a fixed or mobile digital broadcast receiver capable of receiving digital broadcast signals.

Meanwhile, the block diagram of the display device 100 shown in FIG. 1 is disclosed for only for illustrative purposes for one embodiment of the present disclosure, and the respective components of the display device 100 shown in FIG. 1 can be integrated, added or omitted according to the specifications of the digital device 100 which is actually implemented.

That is, if necessary, two or more components may be combined into one component, or one component may be subdivided into two or more components. In addition, the functions performed in each block are intended to explain the embodiment of the present disclosure, and the specific operation or device does not limit the scope of the present disclosure.

FIG. 2 is a perspective view illustrating an example of the display device according to an embodiment of the present disclosure.

Referring to FIG. 2, the display device 100 may have a rectangular body 100' including a first long side (LS1), a second long side (LS2) facing the first long side (LS1), a first short side (SS1) adjacent to the first long side (LS1) and the second long side (LS2), and a second short side (SS2) facing the first short side (SS1).

Here, the first short side area (SS1) is referred to as a first side area. The second short side area (SS2) is referred to as a second side area facing the first side area. The first long side area (LS1) is referred to as a third side area that is adjacent to the first side area and the second side area while being disposed between the first side area and the second side area. The second long side area (LS2) is referred to as a fourth side area that is adjacent to the first side area and the second side area while being disposed between the first side area and the second side area.

In addition, although the length of the first and second long sides LS1 and LS2 is longer than the length of the first and second short sides SS1 and SS2 as shown in FIG. 2, the scope of the present disclosure is not limited thereto, and the length of the first and second long sides LS1 and LS2 may also be approximately the same as the length of the first and second short sides SS1 and SS2 as needed.

In addition, the first direction (DR1) may be a direction parallel to each of the long sides LS1 and LS2 of the display device 100, and the second direction (DR2) may be a direction parallel to each of the short sides SS1 and SS2 of the display device 100. The third direction (DR3) may be a direction perpendicular to the first direction (DR1) and/or the second direction (DR2).

From another point of view, the side where the display device 100 displays an image may be referred to as a front side or a front surface. When the display device 100 displays an image, the side where no image is observed may be referred to as a back side or a back surface. When the display device 100 is viewed from the front side or the front surface, the first long side (LS1) may be referred to as an upper side or an upper surface. Similarly, the second long side (LS2) may be referred to as a lower side or a lower surface. Similarly, the first short side (SS1) may be referred to as a right side or a right surface, and the second short side (SS2) may be referred to as a left side or a left surface.

In addition, the first long side (LS1), the second long side (LS2), the first short side (SS1), and the second short side (SS2) may be referred to as an edge of the display device 100. A point where the first long side (LS1), the second long side (LS2), the first short side (SS1), and the second short side (SS2) meet each other may be referred to as a corner. For example, a point where the first long side (LS1) and the first short side (SS1) meet each other may be referred to as a first corner (C1). A point where the first long side (LS1) and the second short side (SS2) meet each other may be referred to as a second corner (C2). A point where the second short side (SS2) and the second long side (LS2) meet each other may be referred to as a third corner (C3). A point where the second long side (LS2) and the first short side (SS1) meet each other may be referred to as a fourth corner (C4).

Here, the direction from the first short side (SS1) to the second short side (SS2) or the direction from the second short side (SS2) to the first short side (SS1) may be referred to as a horizontal direction (LR). The direction from the first long side (LS1) to the second long side (LS2) or from the second long side (LS2) to the first long side (LS1) may be referred to as a vertical direction (UD).

The display device 100 according to the present disclosure may change the shape of the display module 150 using the LED or OLED instead of a liquid crystal, as shown in FIG. 2(*a*) or FIG. 2(*b*). That is, the backlight unit may be omitted, and the display device can be changed in shape within a predetermined range, so that the curved display device 100 can be implemented as shown in FIG. 2(*b*) using the above-described characteristics.

The display device 100 according to the present disclosure is a variable display device 100 in which a user can adjust a curvature according to a situation, rather than a curved display device fixed in a curved state. The display device 100 may further include a curvature adjustment unit capable of changing a curvature of the main body 100' configured to include the display module 150.

Figure 3:
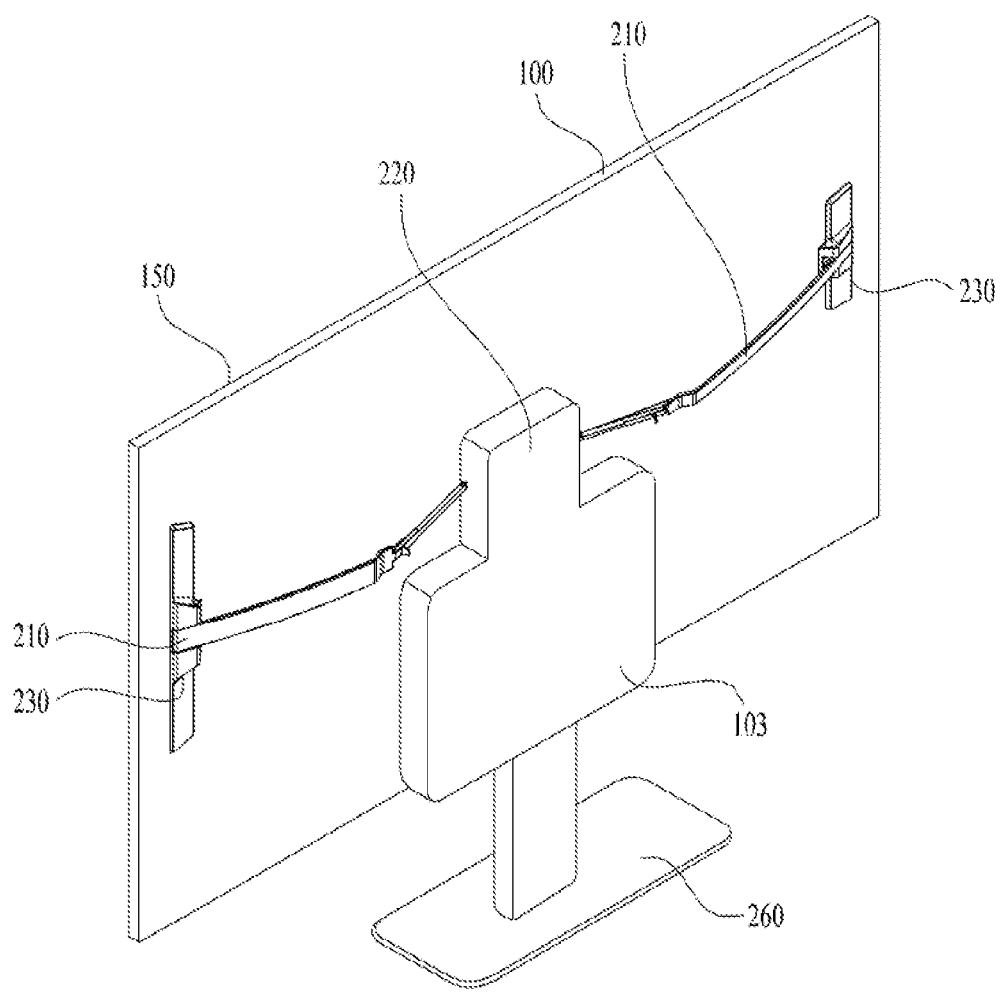
FIG. 3 is a rear view illustrating a display device according to an embodiment of the present disclosure.
Figure 4:
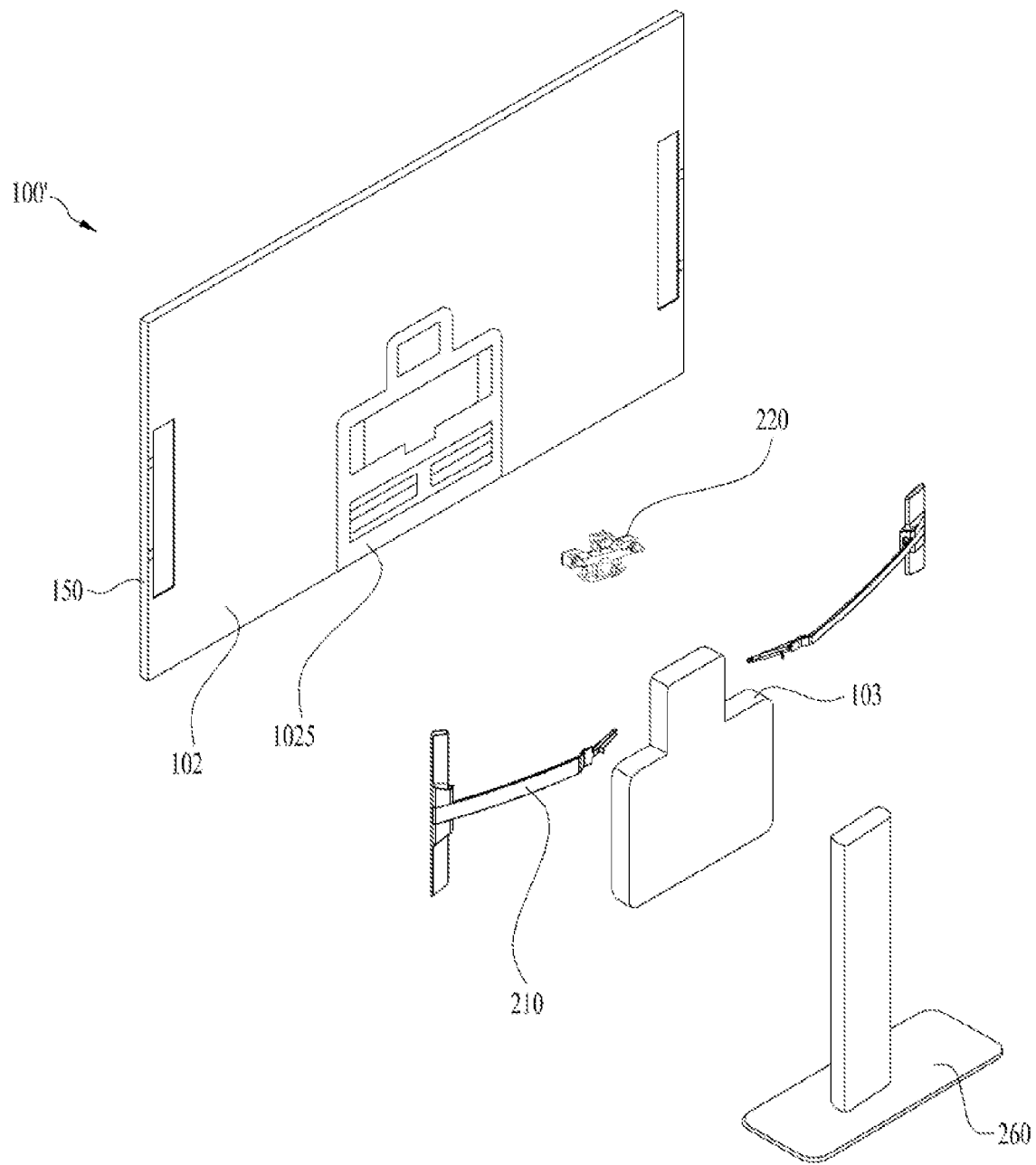
FIG. 4 is an exploded perspective view illustrating a display device according to an embodiment of the present disclosure.

FIG. 3 is a rear view illustrating the display device 100 according to an embodiment of the present disclosure. FIG. 4 is an exploded perspective view illustrating the display device 100 according to an embodiment of the present disclosure. Referring to FIGS. 3 and 4, the display device 100 may include a main body 100', a stand 260 for mounting the main body 100' on the floor, a controller 180, and curvature adjustment units 210, 220, and 230.

The main body 100' including the display module 150 may include a cover bottom 102 that covers a back surface of the display module 150 to which an image is output. A heat dissipation structure for discharging heat generated by the display module 150 may be provided at the inner surface of the cover bottom 102, and the main body 100' may further include a reinforcing material for reinforcing rigidity.

The cover bottom 102 may cover the back surface of the display module 150, may reinforce the rigidity of the display module 150, and may protect the back surface of the display module 150. In particular, the display module 150 may cover a driving IC of the display extending in a backward direction of the display module 150. A main substrate may be mounted on the back surface of the cover bottom 102 as a controller for controlling the display module 150, and a hole may be formed in the cover bottom 102 to interconnect the main substrate and the driving IC of the display module 150.

A separate bracket 1025 may be further provided so that the controller 180, such as a main board, can be mounted thereto. The display device 100 according to the present disclosure may further include a curvature adjustment unit for changing the curvature of the main body 100' other than the controller for controlling the display module 150 on the back surface of the cover bottom 102.

The curvature adjustment unit may further include a pair of links 210, a bending module 220 located at the center of the display device 100 and coupled to one end of the pair of links 210, and a pair of link brackets 230 disposed between the other end of the pair of links 210 and the cover bottom 102.

FIG. 5 is a top view illustrating the display device 100 according to an embodiment of the present disclosure. As shown in FIGS. 5(*a*) and 5(*b*), the curvature of the display device 100 may be changed according to the angle formed by the pair of links 210. The angle of the pair of links 210 may be adjusted according to a change in the position of the moving block 221 of the bending module 220.

The other end of the pair of links 210 may be slidably coupled to the link bracket 230. When the link bracket 230 is fixed to the link bracket 230, the curvature of the display module 150 is large at the end thereof so that it is difficult to implement a natural curved surface of the display module 150.

Accordingly, if the angle of the pair of links 210 is adjusted by the bending module 220, the other end of the link 210 slidably moves on the link bracket 230, so that a natural curved surface of the display module 150 can be implemented.

The bending module 220 may include a moving block 221 connected to one end of the link 210 and movable forward and backward, a guide shaft 222 for guiding the moving block 221 to move forward and backward without moving in the horizontal direction, and a module bracket 228 for receiving the bending module 220.

The link 210 is rotatably coupled to the link fixing unit 215 extending from the bending module 220. The link 210 may rotate around the link fixing pin 213 fastened to the link fixing unit 215, and one end and the other end of the link 210 may move in opposite directions.

When the user pulls the horizontal ends SS1 and SS2 of the main body 100' in a forward direction, the bending module 220 may allow the other end of the link 210 located on the horizontal ends SS1 and SS2 of the main body 100' to move in a forward direction, the link 210 may rotate around the link fixing pin 213, and one end of the link 210 may move in a backward direction.

In contrast, when the user pushes the horizontal ends SS1 and SS2 of the main body 100' in a backward direction so as to use the display device as a flat display, the other end of the link 210 may move backward and one end of the link 210 may move forward. A coupling position of the link fixing pin 213 may be located closer to one end of the link 210 than the other end of the link 210, and the movement distance of one end of the link 210 may be shorter than the movement distance of the other end of the link 210.

As described above, the user may manually change the curvature of the display device 100 by applying force to the horizontal ends SS1 and SS2 of the main body 100. At this time, the pair of links 210 is synchronized with the bending module 220 and simultaneously moved. As a result, the other side SS2 can also move at the same time when the user pulls or presses one side SS1 of the main body 100'.

However, according to the manual driving method, the user may apply force directly to the display module 150, there is a high risk of damage to the display module 150, and a motor is provided in the bending module 220, so that the curvature of the display module 150 can be changed.

For example, the guide shaft 222 may be formed in a spiral shape, and a spiral groove corresponding to the spiral of the guide shaft 222 may be formed in the moving block 221. When the motor rotates the guide shaft 222, the moving block 221 may move forward and backward.

When the moving block 221 of the bending module 220 moves backward, one end of the link 210 coupled to the moving block 221 moves backward, the other end of the link 210 moves forward, and the angle of the pair of links 210 may vary. The bending module 220 may induce a change in the angle of the links 210, and the display module 150 may again transition to the bent state or the flat state.

The display device 100 may further include a back cover 103 for covering the bending module 220 and the controller, and may further include a stand 260 for holding the main body 100' of the display device 100 on the floor. Instead of the stand 260, the display device 100 may further include a wall bracket that can be installed on the wall, and the stand 260 and the wall bracket may be coupled to the back cover 103.

In addition, the moving block 221 according to the present embodiment may move forward and backward along the guide shaft 222 protruding from the back surface of the main body 100'. One end of the link 210 may be coupled to the moving block 221, and may be rotatably coupled to the moving block 221 through the operation pin 226 to change the angle thereof according to movement of the moving block 221.

Hereinafter, specific embodiments of the display device described above will be described with reference to FIGS. 1 to 5. However, in FIGS. 1 to 5, the display device (hereinafter referred to as a bendable display device) capable of changing the curvature thereof has been mainly described for convenience of description, the scope or spirit of the present disclosure is not limited thereto, and the following description will be given centering upon an embodiment capable of being implemented in the display device including the bendable display device.

FIG. 6a is a diagram illustrating a light structure of the display device according to an exemplary embodiment of the present disclosure. Hereinafter, descriptions overlapping with the above-described drawings will herein be omitted for brevity.

FIG. 6a (a) is a diagram illustrating a rear structure of the display device, and FIG. 6(b) is a diagram illustrating a detailed light structure.

Referring to FIG. 6a (a), the display device may further include a back cover 103 for covering the main body 100' and the controller (not shown). Alternatively, unlike the back cover 103, the display device may be manufactured in a wider shape as shown in FIG. 6a (a). In this case, the display device may include at least one light (601, 602, 603, 604, 605, 606). At this time, the at least one light (601, 602, 603, 604, 605, 606) may include six LED bars. Here, the LED bar may be a lamp in which LED elements are arranged in a long length, and may correspond to an electronic lamp that emits light by flowing a current after LEDs were arranged at regular intervals through a stick or pipe. The LED bar may be manufactured to have various lengths and various shapes (such as an aluminum LED bar, a lens-type LED bar, a waterproof LED bar, etc.), and may have flexibility depending on the material types.

Referring to FIG. 6a (b), at least one light 601, 602, 603, 604, 605, 606 may be attached on the back cover 103. At this time, the at least one light 601, 602, 603, 604, 605, and 606 may be symmetrical with respect to a vertical axis. More specifically, each of the first LED bar 601 and the second LED bar 602 may have a bar structure in which a vertical length is longer than a horizontal length. The third LED bar 603, the fifth LED bar 605, the fourth LED bar 604, and the sixth LED bar 606 may be attached to the back cover 103 to form an X-shape. In particular, each of the third LED bar 603 and the fourth LED bar 604 are longer in length than each of the fifth LED bar 605 and the sixth LED bar 606.

However, the exemplary embodiments of the present disclosure are not limited to the light structure of FIG. 6a. For example, at least one light may include four LED bars that are respectively attached to the first long side (LS1), the second long side (LS2), the first short side (SS1), and the second short side (SS2) of the main body 100'.

FIG. 6B is a diagram illustrating the display device when viewed from various directions according to an exemplary embodiment of the present disclosure.

FIG. 6B(a) is a front view illustrating a display device according to an embodiment of the present disclosure, FIG. 6B(b) is a rear view (back view) illustrating a display device according to an embodiment of the present disclosure, FIG. 6B(c) is a side view illustrating a display device according to an embodiment of the present disclosure, and FIG. 6B(d) is a top view illustrating a display device according to an embodiment of the present disclosure.

Referring to FIG. 6B(c), unlike in FIGS. 3 and 4, the display device 100 may be configured such that the display module 150 is bent (or curved) through connection to the link 210 while being spaced apart from a stand 260.

That is, even when the display module 150 is manufactured as shown in FIG. 6B, the display module 150 can be bent in the manner described above with reference to FIGS. 1 to 5.

Hereinafter, specific embodiments of the display device described above will be described with reference to FIGS. 1 to 6B. However, in FIGS. 1 to 6B, the display device (hereinafter referred to as a bendable display device) capable of changing the curvature thereof has been mainly described for convenience of description, the scope or spirit of the present disclosure is not limited thereto, and the following description will be given centering upon an embodiment capable of being implemented in the display device including the bendable display device.

Figure 7:
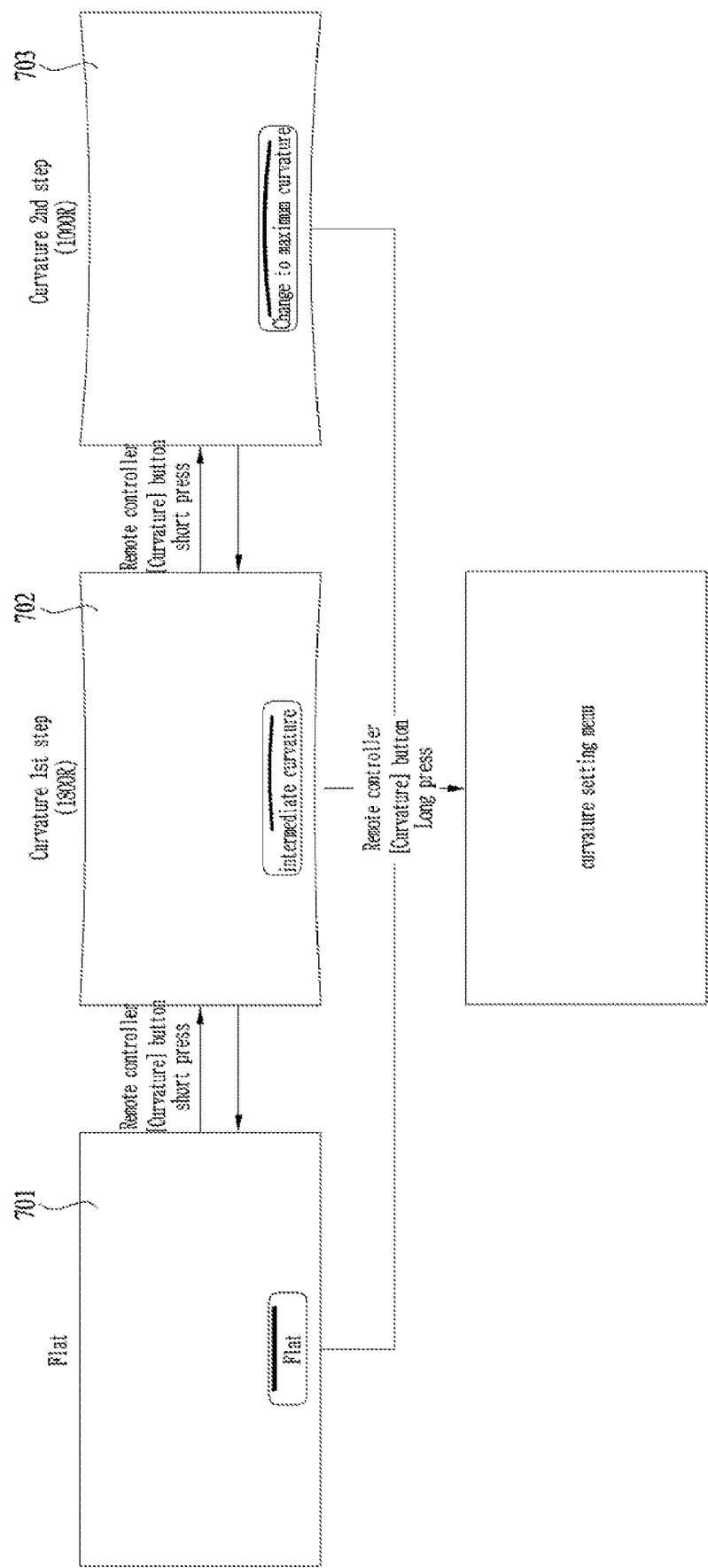
FIG. 7 is a diagram illustrating a basic operation of a display device according to an embodiment of the present disclosure.

FIG. 7 is a diagram illustrating a basic operation of the display device according to an embodiment of the present disclosure. Hereinafter, descriptions overlapping with the above-described drawings will herein be omitted for brevity.

In particular, FIG. 7 illustrates an operation scenario of a change in the curvature of the display module of the display device.

The display module of the display device may have a flat mode 701 in which the display module is flat, a first bending mode 702 in which the display module has a first curvature, and a second bending mode 703 in which the display module has a second curvature. Here, the first curvature is set to 1800R and the second curvature is set to 1000 R for convenience of description, but is not limited thereto. That is, the second curvature may correspond to a maximum curvature that the display module can have, and the first curvature and the second curvature may be determined when the display device is manufactured or may be set by user's setting as described below in FIG. 8.

Referring to FIG. 7, the display module of the display device may receive a first control signal for selecting a curvature button from the remote controller in a state where the display module is in the flat mode 701. Here, the first control signal for selecting the curvature button may correspond to an input signal generated when the user short-presses the curvature button of the remote controller.

According to one embodiment of the present disclosure, as the display module receives the first control signal generated by selection of the curvature button in a situation where the display module is in the flat mode 701, the display module can transition from the flat mode 701 to the first bending mode 702. That is, the display device can allow the bending module to change the curvature of the display module. The configuration of controlling the bending module to change the curvature of the display module may be shown in FIGS. 1 to 5.

According to one embodiment of the present disclosure, as the display device receives the first control signal generated by selection of the curvature button in a situation where the display module is in the first bending mode 702, the display device may switch the display module from the first bending mode 702 to the second bending mode 703.

That is, the display device may control the display module to be switched in the order of the first bending mode 702 and the second bending mode 703 based on the first control signal in a situation where the display module is in the flat mode 701.

Also, according to one embodiment of the present disclosure, as the display module receives a second control signal in a situation where the display module is in the second bending mode 703, the display device may allow the display module to transition from the second bending mode 703 to the first bending mode 702. As the display module receives the second control signal in a situation where the display module is in the first bending module 702, the display module can transition from the first bending mode 702 to the flat mode 701.

That is, the display device can switch the display module in the order of the first bending mode 702 and the flat mode 701 based on the second control signal in a situation where the display module is in the second bending mode 703. In this case, the second control signal may be the same control signal as the first control signal or may be a different control signal from the first control signal. For example, the first control signal may correspond to a signal generated when the curvature-UP button of the remote controller is selected, and the second control signal may correspond to a signal generated when the curvature-down button of the remote controller is selected.

Also, according to one embodiment of the present disclosure, as the display module receives a third control signal in a situation where the display module is in the first bending mod 702 and the second bending mode 703, the display device may output the curvature setting menu. At this time, unlike the first control signal and the second control signal, the third control signal may correspond to a signal generated when the user long-presses the curvature button of the remote controller. This will be described in detail with reference to FIG. 8.

Figure 8:
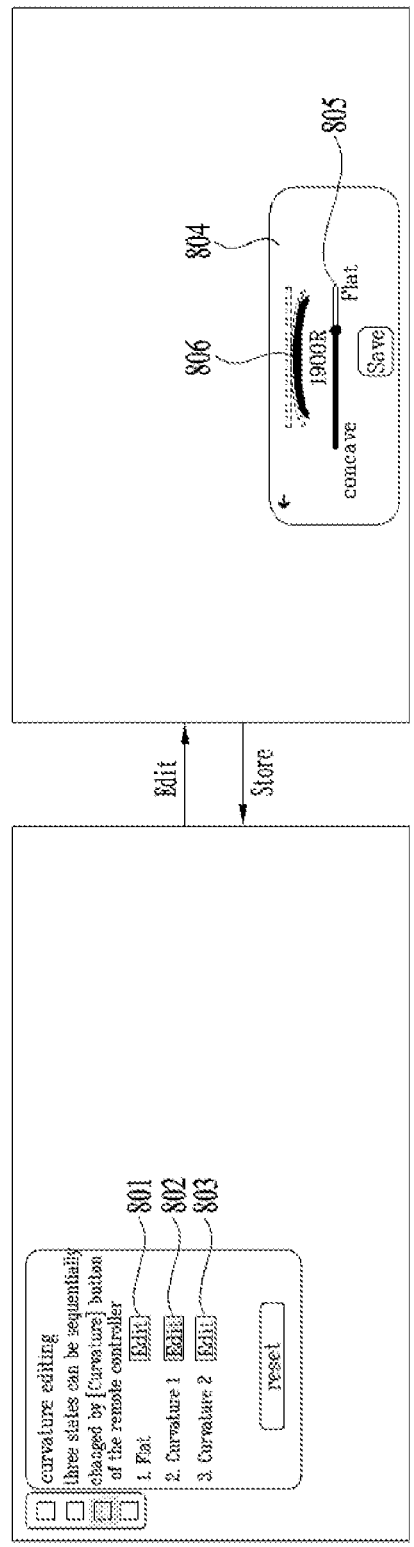
FIG. 8 is a diagram illustrating a curvature setting menu of a display device according to an embodiment of the present disclosure.

FIG. 8 is a diagram illustrating the curvature setting menu of the display device according to an embodiment of the present disclosure. Hereinafter, descriptions overlapping with the above-described drawings will herein be omitted for brevity.

Referring to FIG. 8, as the display module receives the third control signal in a situation where the display module is in an arbitrary mode as shown in FIG. 7, the display device may output the curvature setting menu.

As can be seen from the left side of FIG. 8, the display device may output a flat mode editing icon 801, a first bending mode editing icon 802, and a second bending mode editing icon 803 through the curvature setting menu.

According to one embodiment of the present disclosure, the display device may receive a control signal that selects the flat mode editing icon 801, the first bending mode editing icon 802, and the second bending mode editing icon 803. For example, the display device may receive an input signal generated by short-pressing of the first bending mode editing icon 802 from the remote controller. Hereinafter, the following description will be given with reference to the embodiment for receiving the control signal generated by selection of the first bending mode editing icon 802, the scope or spirit of the present disclosure is not limited thereto, and it should be noted that the curvature can also be changed in each of the flat mode and the second bending mode through the same method as the above-described method.

Referring to the right drawing of FIG. 8, as the display device receives a control signal required to select the first bending mode editing icon 802, the display device may output the first bending mode editing pop-up window 804.

The first bending mode editing pop-up window 804 may include a slider 805 for finely adjusting the curvature of the display module. The display device may determine the curvature of the first bending mode based on a control signal that adjusts the slider 805. At this time, the curvature of the display module can be precisely adjusted through the slider 805 in units of 100R within the range from 1000R to a flat level. The user can set the curvature of the first bending mode while enabling the slider 805 to move horizontally in the direction from the left side (corresponding to the curved mode) to the right side (corresponding to the flat mode). At this time, the display device may output the curvature of the first bending mode set by the user as a preview 806 through the first bending mode editing pop-up window 804.

In the same manner as described above, the display device may set the flat mode, the first bending mode and the second bending mode according to the user setting. That is, the display device may store the curvature that is individually set by the user in addition to the preset curvatures of the flat mode, the first bending mode, and the second bending mode that have been set at the time of shipment. In this case, the display device may store the user-setting curvature in the above-described memory.

Then, when the display device receives a control signal selecting the first bending mode from the user based on the stored curvature, the display module can switch the display module to the changed curvature according to the user setting.

In addition, the display module 150 of the display device 100 will hereinafter be described with reference to FIGS. 9 to 20. Accordingly, although only the display module 150 is shown in the drawings, the scope or spirit of the present disclosure is not limited thereto, and it should be noted that the display device 100 can enable the display module 150 to switch to any one of a flat mode, a first bending mode, and a second bending mode through operation of the above-described bending module 220. That is, for convenience of description, the bending module 220 will be omitted from the following description.

A gamer who has a unique outlook on the game world may seek his or her optimized setting for each game genre, and may want to use a desired game by maximizing game performance of a game console. Accordingly, user experience (UX) satisfying the need of "customization" according to gamers' tastes and game types may be preferred. In other words, user experience (UX) suitable for gamer's convenience may be preferred.

The game setting UX may be provided with a function of setting an optimizer mode, a function of quickly and easily entering a main screen, and a function of confirming a state of the game in real time. The game play UX may be provided with a screen resizing function and a screen division function.

At this time, the game launcher function, which can quickly and easily enter the main screen, may search for game input and content at one place, and may reflect personal preferences by setting a background screen. It can be seen that an intuitive dedicated key entry method is preferred as an additional need.

In addition, the game dashboard function capable of confirming a state of the game in real time can impart a feeling to the gamer according to the needs to check the game status in real time. If necessary, the game dashboard function may be displayed on a minimum space within the game screen image rather than on a mobile phone, and it can be seen that the game dashboard function can be activated by long pressing the game-only key.

At this time, the function of setting the optimizer mode may provide a useful function capable of quickly setting an individual optimized mode. If necessary, the function of setting the optimizer mode can provide game genres, image quality, sound configuration, and recommended setting guides for each genre.

In addition, the screen resizing function may be played with an optimal size for each game without a cumbersome process, and the screen division function may be processed in multi-tasking and may implement a dual effect with one monitor.

Hereinafter, embodiments in which the above-described display device 100 outputs a user interface satisfying the needs of gamers, thereby providing the gamers with rich user experience (UX) will be described with reference to FIGS. 9 to 20.

Figure 9:
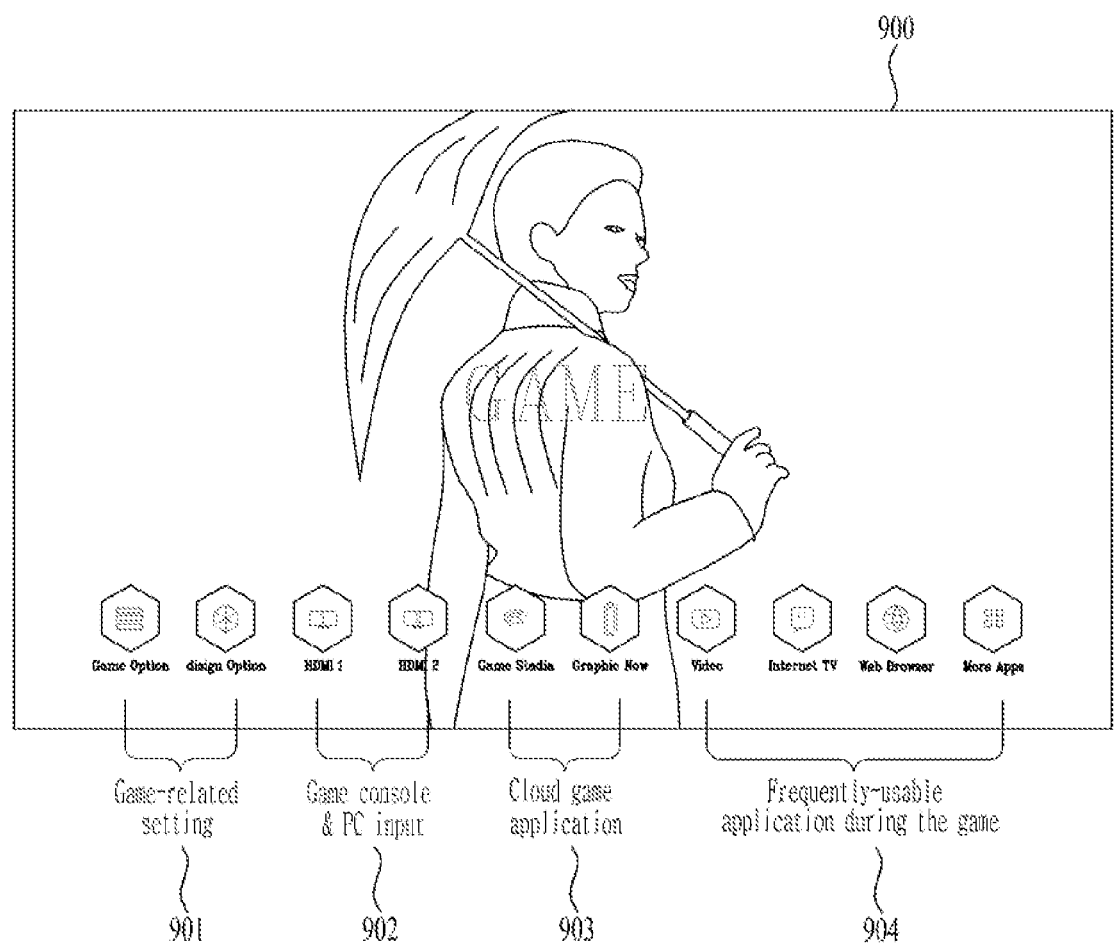
FIG. 9 is a view illustrating an example of a game launcher of a display device according to an embodiment of the present disclosure.

FIG. 9 is a view illustrating an example of a game launcher of the display device according to an embodiment of the present disclosure. Hereinafter, descriptions overlapping with the above description will herein be omitted for brevity.

Referring to FIG. 9, when the display device 100 is powered on, the display device 100 may output a game launcher through the display module 150.

Here, the game launcher may output, on a background image 900 set by the user, icons corresponding to a game-related setting application 901, icons corresponding to the game console & PC input application 902, icons corresponding to a cloud game application 903, and icons corresponding to a frequently-usable application 904 that is likely to be used frequently during the game In more detail, the display device 100 may output an image or video directly set by the user as the background screen 900. In addition, the display device 100 may output a screen image of a game that was clipped by the user through bookmarking or the like, as the background screen 900.

In addition, the display device 100 may output an icon corresponding to the game-related setting application 901. For example, the game-related setting application 901 may include a game optimizer setting application, a background screen image setting application, and the like.

Also, the display device 100 may output an icon corresponding to the game console & PC input application 902. For example, the game console & PC input application 902 may include a PlayStation application and an Xbox application. In this case, the display device 100 may output an external input terminal to which the PlayStation application and the Xbox application are connected together.

In addition, the display device 100 may output an icon corresponding to the cloud game application 903. For example, the cloud game application 903 may include a Google Stadia application and a GeForce Now application.

In addition, the display device 100 may output an icon corresponding to the frequently-usable application 904 that is likely to be used frequently during the game. For example, the application 904 to be used frequently during the game may include a YouTube application, a Twitch application, a web-browser application, and the like. At this time, the display device 100 may output an icon corresponding to the application that the user actually uses frequently during the game. In this case, the application frequently used during the game may be determined based on the number of times the application was executed during game execution.

Figure 10:
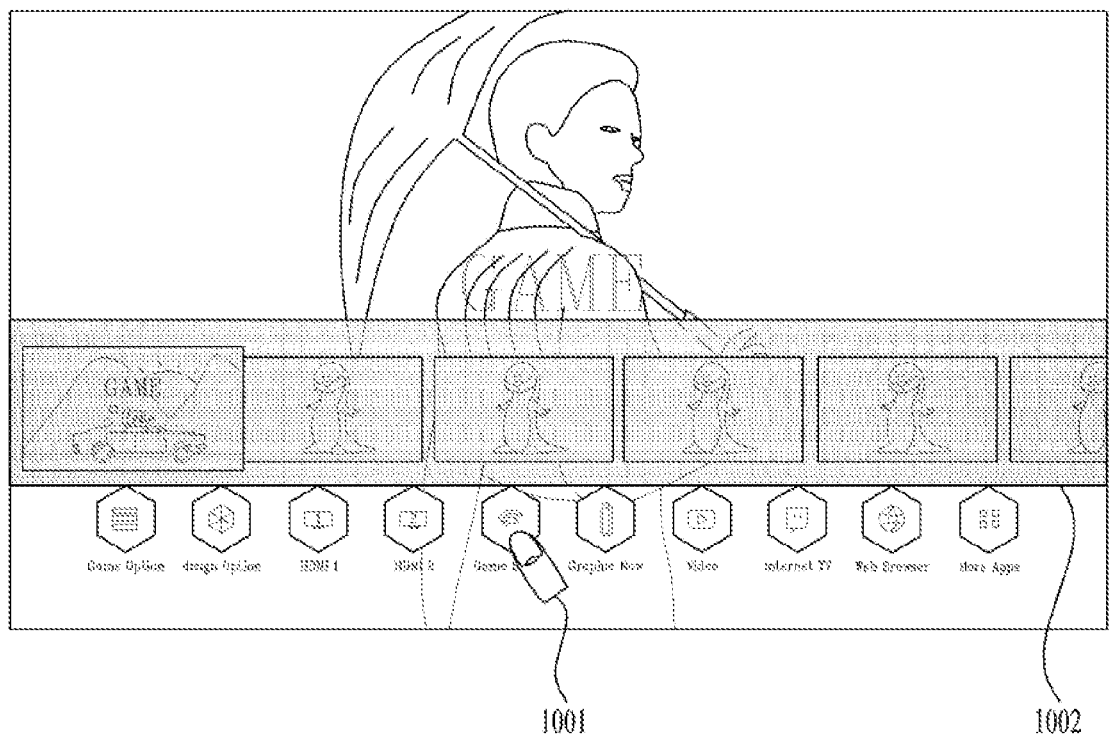
FIG. 10 is a view illustrating an example a game launcher of a display device according to another embodiment of the present disclosure.

FIG. 10 is a view illustrating an example a game launcher of the display device according to another embodiment of the present disclosure. Hereinafter, descriptions overlapping with the above description will herein be omitted for brevity.

Referring to FIG. 10, the display device 100 may output the game launcher described above with reference to FIG. 9.

At this time, the display device 100 may receive a control signal 1001 for focusing the application icon that is being output from the game launcher. At this time, the display device 100 may receive the control signal 1001 for focusing the application icon from a remote controller (not shown in FIG. 9, see '200' of FIG. 1).

In one embodiment of the present disclosure, upon receiving the control signal 1001 required for focusing the application icon, the display device 100 may output a preview 1002 of at least one content item included in the application corresponding to the icon. The preview 1002 of the at least one content item may include a thumbnail corresponding to the at least one content item included in the application. For example, when the application icon is Google Stadia, the display device 100 may output thumbnails of various games included in Google Stadia as a preview 1002.

Figure 11:
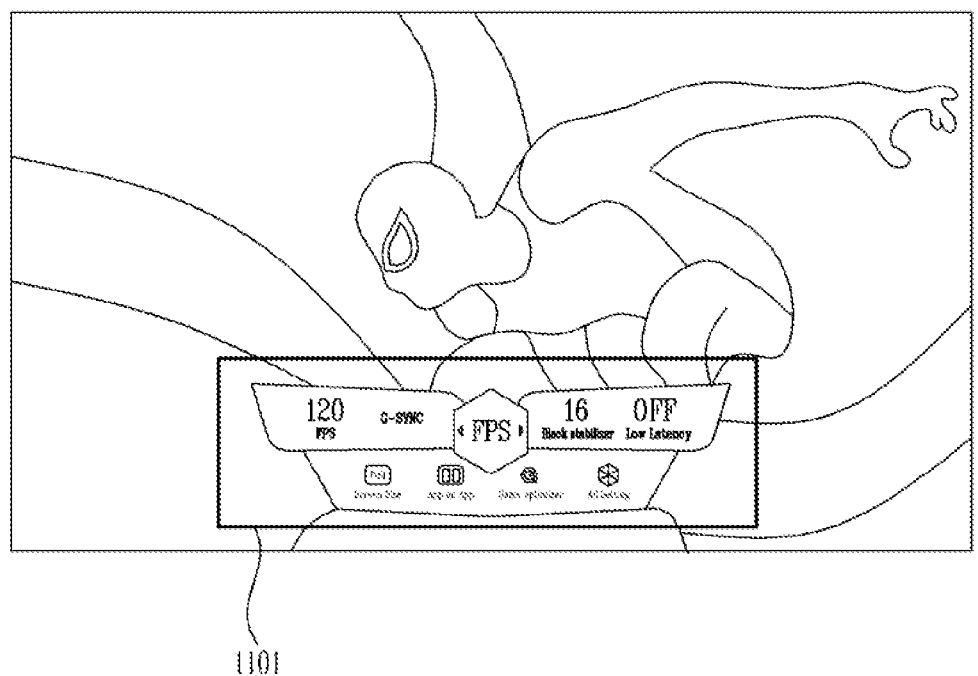
FIG. 11 is a view illustrating an example of a game dashboard of a display device according to an embodiment of the present disclosure.

FIG. 11 is a view illustrating an example of a game dashboard of a display device according to an embodiment of the present disclosure. Hereinafter, descriptions overlapping with the above description will herein be omitted for brevity.

Referring to FIG. 11, the display device 100 may output a game dashboard 1101. At this time, the game dashboard 1101 may include information capable of checking the real-time state of the game being output from the display module 150.

More specifically, the game dashboard 1101 may include an FPS value of a game being displayed on the current display module 150, the type of a graphics card being used, a dark map mode setting (black stabilizer) value, a low latency setting value, a screen size setting menu, an App-on-App application setting menu, a game optimizer setting menu, and all setting menus. A detailed description of each of the above-described menus included in the game dashboard 1101 will be described later with reference to FIG. 12.

In particular, the display device 100 may output only four values (i.e., the FPS value of the game being used, the type of a graphics card being used, the dark map mode setting (black stabilizer) value, and the low latency setting value) at the upper end of the game dashboard 1101. At this time, the four values being output at the upper end of the game dashboard 1101 may be selected as shown in FIG. 12 to be described later.

Accordingly, the gamer can quickly check the state of the currently played game through the game dashboard 1101.

Figure 12:
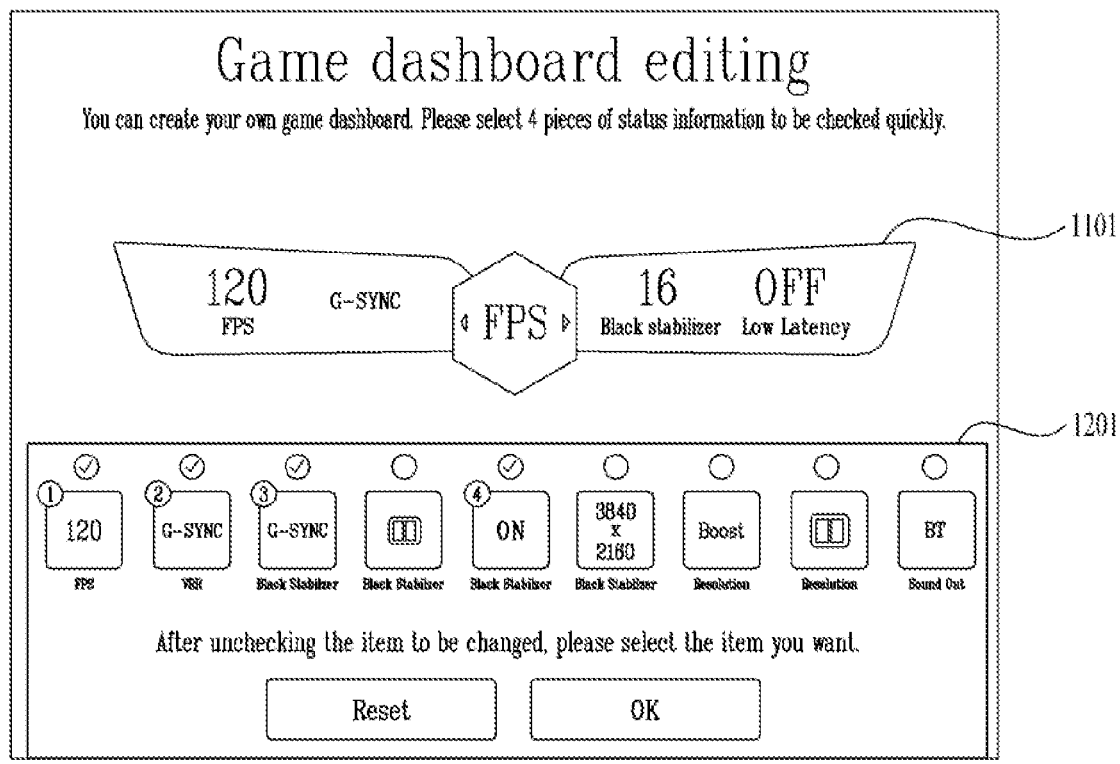
FIG. 12 is a view illustrating an example of editing a game dashboard of a display device according to an embodiment of the present disclosure.

FIG. 12 is a view illustrating an example of editing the game dashboard of the display device according to an embodiment of the present disclosure. Hereinafter, descriptions overlapping with the above description will herein be omitted for brevity.

Referring to FIG. 12, the user may edit the game dashboard 1101 described above in FIG. 11. More specifically, the display device 100 may provide the user with an interface 1201 through which information being output to the game dashboard 1101 can be selected.

The interface 1201 may include an FPS value of the content being output, a type of a graphics card in use, a dark map mode setting (black stabilizer) value, an HDR setting value, a low latency setting value, a resolution setting value, an input lag setting value, an audio setting value, and a sound setting value. The display device 100 may receive four values selected by the user from among the above-described values included in the interface 1201.

Here, the FPS value may represent frames per second of the content being output, and the type of graphics card in use may represent the type of graphics card being used while the display device 100 outputs the content. In addition, the dark map mode (black stabilizer) may refer to a mode for increasing the contrast ratio of a dark screen image, so that the user can easily find enemies hidden in a dark place when playing the game according to the dark map mode setting value. Here, the input lag is a term that refers to an input latency generated during a response time (latency), and this term "input lag" is a function of adjusting the time taken for an image signal created by the graphics card to be visualized on the display device 100.

In one embodiment of the present disclosure, the display device 100 may receive an FPS value, the type of a graphics card, a dark map mode setting (black stabilizer) value, and a low latency setting value from among values included in the interface 1201. At this time, the display device 100 may receive a control signal for selecting four setting values from among various setting values included in the interface 1201 from the remote controller 200, and may then receive a control signal for selecting an OK button. Accordingly, the display device 100 may output the selected four setting values (i.e., the FPS value, the graphics card type, the dark map mode setting value, and the low latency setting value) to the game dashboard 1101.

Figure 13:
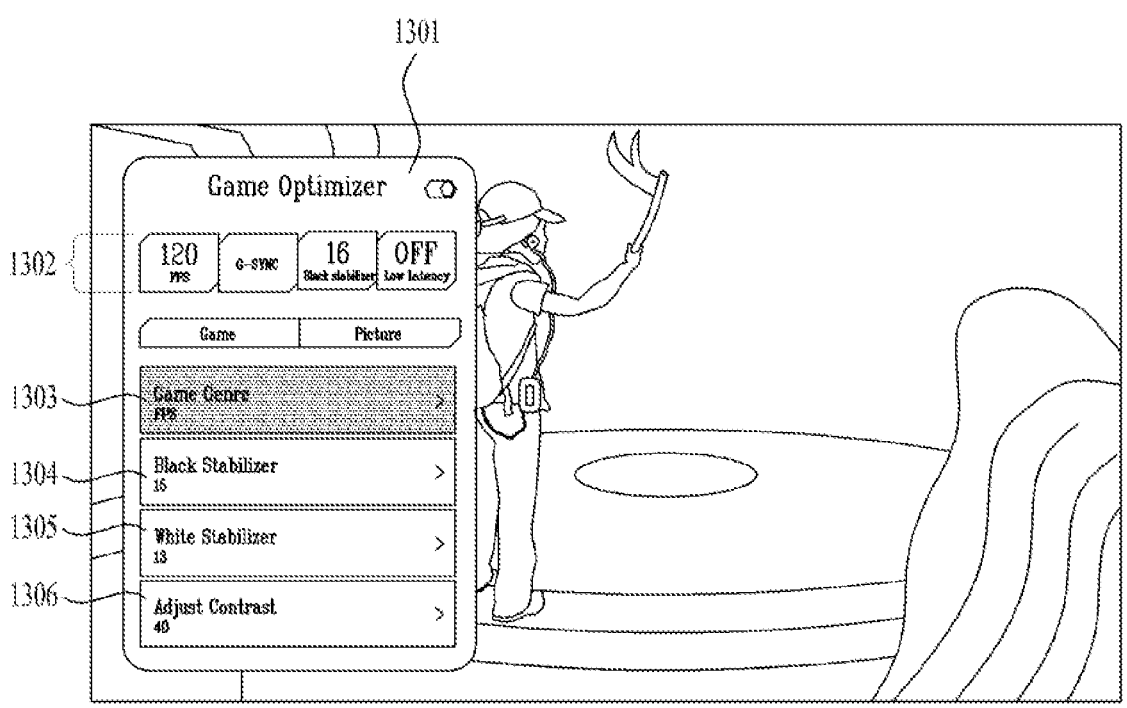
FIG. 13 is a view illustrating a method of setting a game optimizer according to an embodiment of the present disclosure.

FIG. 13 is a view illustrating a method of setting the game optimizer according to an embodiment of the present disclosure. Hereinafter, descriptions overlapping with the above description will herein be omitted for brevity.

Referring to FIG. 13, the display device 100 may provide a game optimizer setting (Game Optimizer) 1301 so that the display device 100 can provide the game being output through the display module 150 to the user in a more customized way.

The game optimizer setting 1301 may provide specific settings of the screen as well as the function 1302 being output to the above-described game dashboard 1101.

More specifically, the game optimizer setting 1301 may include a game genre setting (Game Genre) 1303, a black stabilizer setting (Black Stabilizer) 1304, a white stabilizer setting (White Stabilizer) 1305, and an adjust contrast setting (Adjust Contrast) 1306.

The game genre setting 1303 may correspond to the function of setting the genre of the currently played game. The display device 100 may automatically set the game genre for the game being played, but individual setting of the game genre is also possible based on a user's request.

In addition, the black stabilizer setting 1304 referred to as the same term as the dark map mode setting (black stabilizer) may correspond to the function of setting the contrast of the dark screen. When the contrast increases in the dark screen, the user can easily find the enemy hidden in the dark place. Similarly, the white stabilizer setting 1305 may correspond to the function of setting the contrast in a bright screen image, so that the contrast can increase or decrease in the bright screen. The white stabilizer setting 1305 may enable the contrast in the bright screen to be increased or decreased according to the user's needs. In addition, the contrast ratio setting (Adjust Contrast) 1306 may correspond to a function of setting the contrast ratio for content being output through the display module 150.

As such, the display device 100 may provide the game optimizer setting 1301, so that the user can enjoy the game with the user-optimized setting.

Figure 14:
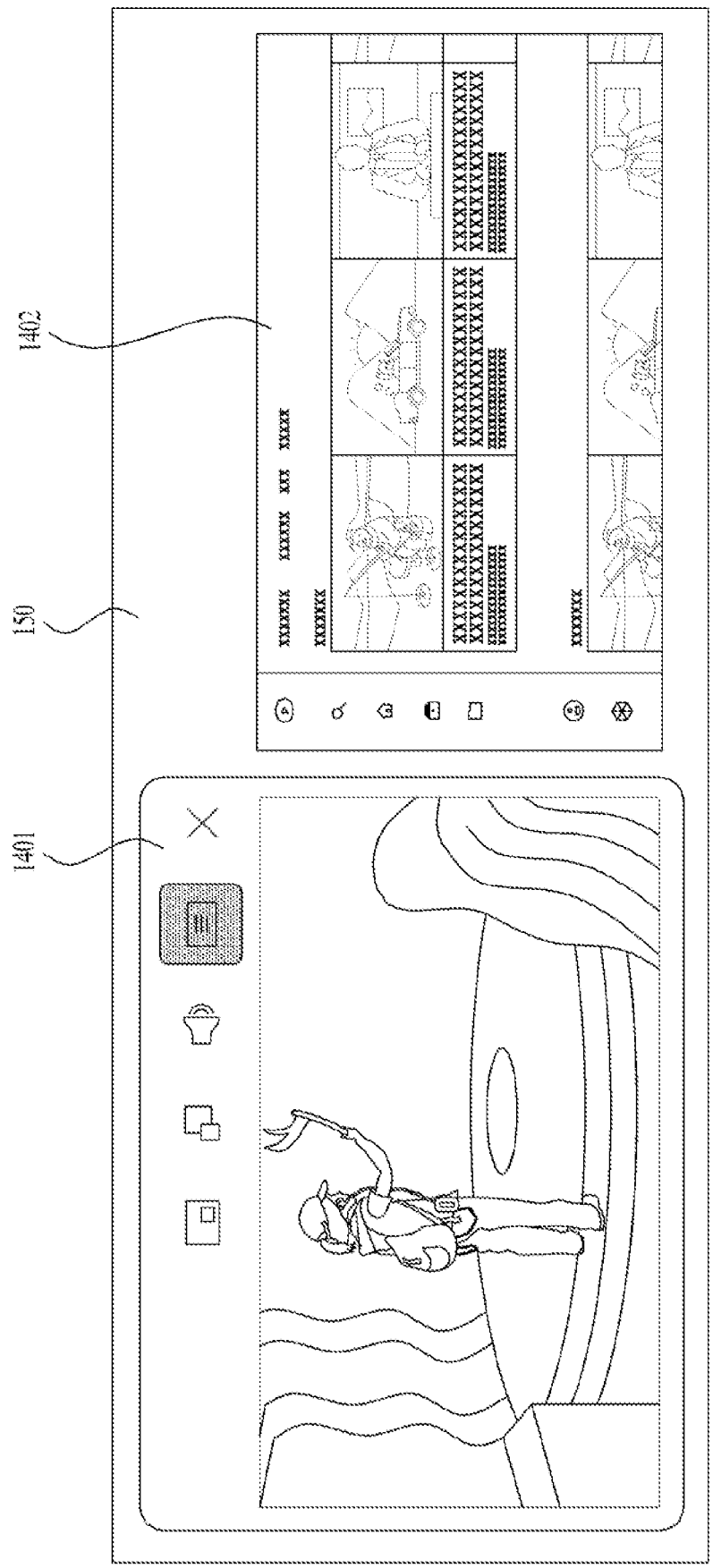
FIG. 14 is a view illustrating a method for screen division of a display device according to an embodiment of the present disclosure.
Figure 15:
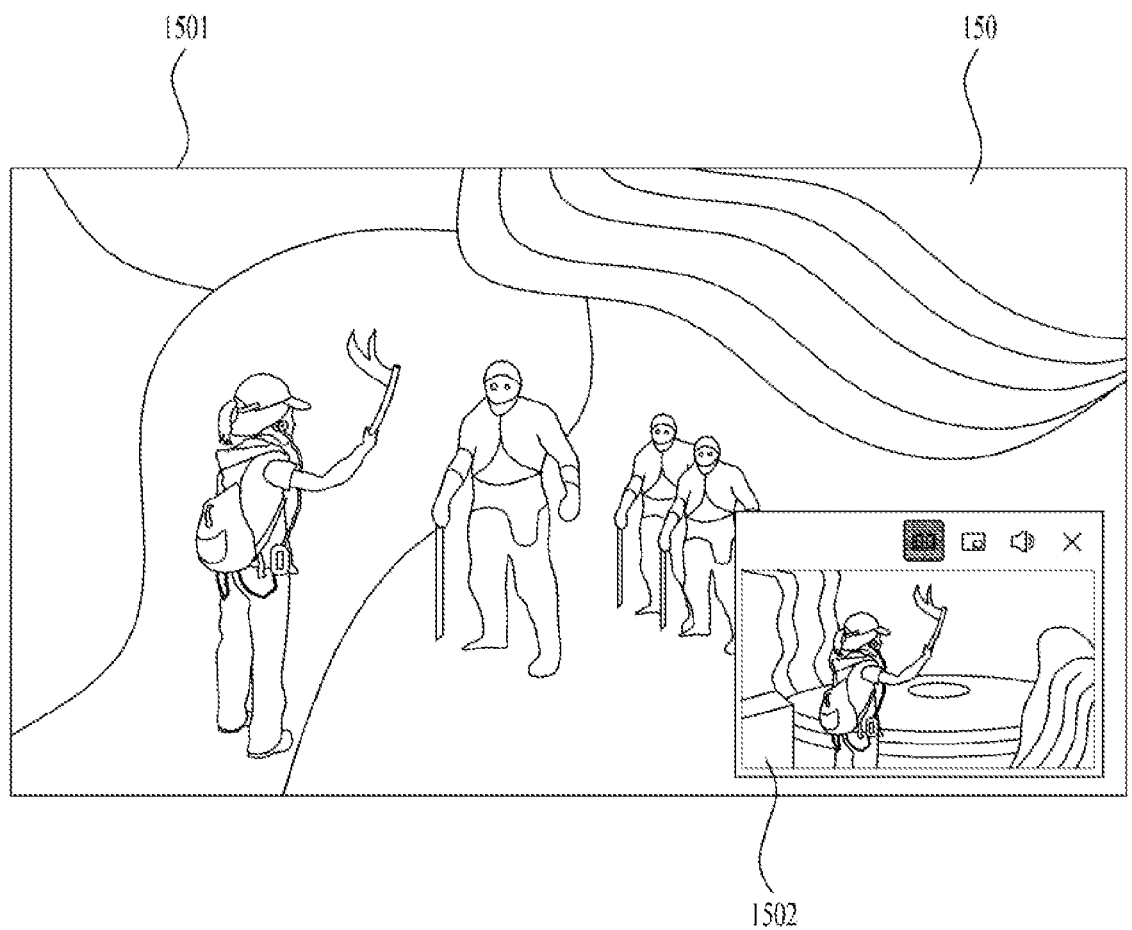
FIG. 15 is a view illustrating a method for screen division of a display device according to another embodiment of the present disclosure.

FIG. 14 is a view illustrating a method for screen division of a display device according to an embodiment of the present disclosure. FIG. 15 is a view illustrating a method for screen division of a display device according to another embodiment of the present disclosure. Hereinafter, descriptions overlapping with the above description will herein be omitted for brevity.

Referring to FIG. 14, the display device 100 may output a plurality of contents 1401 and 1402 to the display module 150. In particular, the display device 100 may divide the display module 150 into two regions (i.e., left and right regions) so as to output two contents 1401 and 1402. Thereafter, the display device 100 may output the first content 1401 to the left region, and may output the second content 1402 to the right region. Such operation may be referred to as a Picture by Picture (PBP) function.

That is, in order to use the plurality of contents 1401 and 1402, the user had to use functions (such as screen minimization and screen maximization functions, etc.) provided by the content. However, according to the present disclosure, the display device 100 can autonomously output the plurality of contents 1401 and 1402 to the divided screens.

Accordingly, the user may watch the second content 1402 (e.g., YouTube application) while using the first content 1401 (e.g., a game). In particular, since it is common for gamers to watch moving images (or video) while playing a game, the screen division function is requisite for the display device 100 to be used for such gamers.

On the other hand, referring to FIG. 15, the display device 100 may output a plurality of contents 1501 and 1502 to the display module 150. Specifically, in order to output two contents 1501 and 1502 to the display module 150, the display device 100 may output the first content 1501 as a full screen image and may output the second content 1502 as a Picture in Picture (PIP) image.

That is, the display device 100 may autonomously provide the picture-in-picture (PIP) function to output two contents in an overlay format.

Accordingly, the user can use the first content 1501 (e.g., the front screen of a main character in the game) and at the same time can use the second content 1502 (e.g., the back screen of the main character in the game). In other words, since the number of 3D games is rapidly increasing in recent years, the user has to simultaneously watch the front screen of the main character in the game and the back screen of the main character in the game, so that it can be expected that the corresponding function is required.

Figure 16:
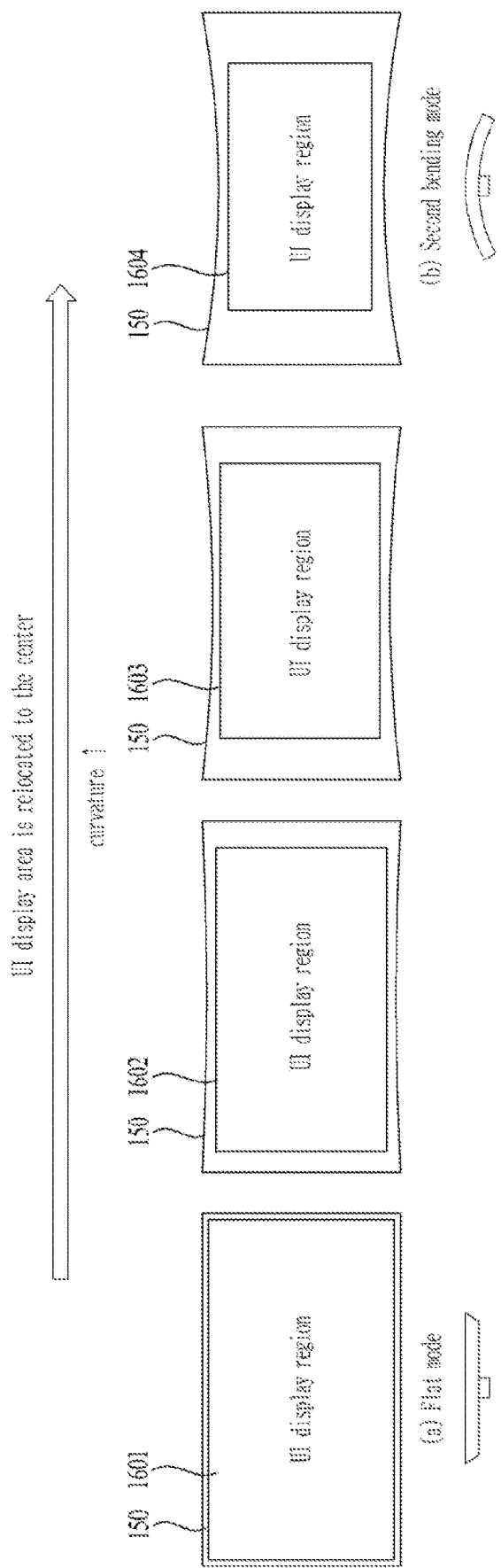
FIG. 16 is a diagram illustrating an example of outputting a user interface differently in response to a curvature of a display device according to an embodiment of the present disclosure.

FIG. 16 is a diagram illustrating an example of outputting a user interface differently in response to a curvature of a display device according to an embodiment of the present disclosure. Hereinafter, descriptions overlapping with the above description will herein be omitted for brevity.

Referring to FIG. 16, as the display module 150 switches to the flat mode, the first bending mode, and the second bending mode, the display device 100 may change at least one of the size and position of display regions 1601, 1602, 1603, and 1604 to which the user interface is output.

In more detail, FIG. 16(*a*) shows a state in which the display module 150 is in the flat mode, and FIG. 16(*b*) shows a state in which the display module 150 is in the second bending mode. When the display module 150 is in the flat mode, the display device 100 may output the user interface to the first region 1601 of the display module 150.

In one embodiment of the present disclosure, the display device 100 may output the user interface to the fourth region 1604 of the display module 150 when the display module 150 is in the second bending mode. In this case, the fourth region 1604 is smaller in size than the first region 1601.

That is, the display device 100 may switch the display module 150 from the flat mode of FIG. 16(*a*) to the second bending mode of FIG. 16(*b*). As the curvature of the display module 150 gradually increases, the display device 100 may switch the display region, which is a region to which the user interface can be output, from the first region 1601 to the fourth region 1604. Here, the first region 1601 is larger than the second region 1602, the second region 1602 is larger than the third region 1603, and the third region 1603 is larger than the fourth region 1604. That is, as the display device 100 switches the display module 150 from the flat mode to the second bending mode, the display device 100 may gradually reduce the size of the display region to which the user interface can be output. In addition, as the display device 100 switches the display module 150 from the flat mode to the second bending mode, the display region to which the user interface can be output can move toward the center of the display module 150.

As the curvature of the display module 150 increases, the user's gaze is generally focused on the center of the display module 150. Accordingly, as the curvature of the display module 150 increases, the display device 100 controls the display region to move toward the center of the display module so that the user interface can be output at the center of the display module 150 in consideration of the user's gaze, thereby reducing the size of the display region.

Figure 17:
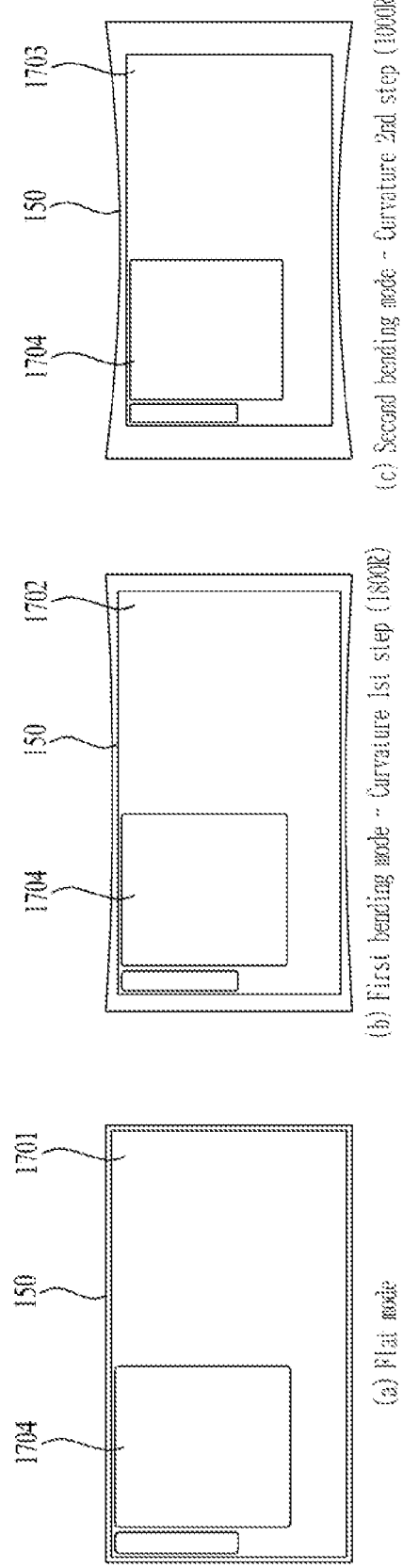
FIG. 17 is a diagram illustrating a method for adjusting the size of a user interface based on a curvature of a display device according to an embodiment of the present disclosure.

FIG. 17 is a diagram illustrating a method for adjusting the size of a user interface based on the curvature of a display device according to an embodiment of the present disclosure. Hereinafter, descriptions overlapping with the above description will herein be omitted for brevity.

FIG. 17(a) is a view illustrating a state in which the display module 150 is in the flat mode, and FIG. 17(b) is a view illustrating a state in which the display module 150 is in the first bending mode, and FIG. 17(c) is a view illustrating a state in which the display module 150 is in the second bending mode.

FIG. 17 illustrates an embodiment of outputting the user interface 1704 to the display region described above in FIG. 16. The user interface 1704 shown in FIG. 17 may correspond to a setting menu being output to the left side of the screen.

In more detail, as the display device 100 switches the display module 150 to the flat mode, the first bending mode, and the second bending mode, the display device 100 can adjust the size and position of display regions 1701, 1702, and 1703 to which the user interface can be output.

In one embodiment of the present disclosure, the display device 100 may output the user interface 1704 to the first region 1701 when the display module 150 is in the flat mode. Also, when the display module 150 is in the first bending mode, the display device 100 may output the user interface 1704 to the second region 1702. Also, when the display module 150 is in the second bending mode, the display device 100 may output the user interface 1704 to the third region 1703.

At this time, as described above in FIG. 16, the first region 1701, the second region 7102, and the third region 1703 become smaller in size as the curvature of the display module 150 increases. As the first region 1701, the second region 1702, and the third region 1703 become smaller in size, the display device 100 may enable the user interface being output to the display region to be displayed as a small-sized user interface.

In addition, when the display module 150 switches the display module 150 from the second bending mode to the flat mode, the display device 100 can enable the user interface 1704 to be displayed with a larger size as the display region gradually increases in size.

That is, when the display module 150 has a curvature, the display device 100 may change the size of the output user interface 1704 as the sizes of the display regions 1701, 1702, and 1703 are changed. Accordingly, the user can use the user interface 1704 without feeling uncomfortable in the display regions 1701, 1702, and 1703.

Figure 18:
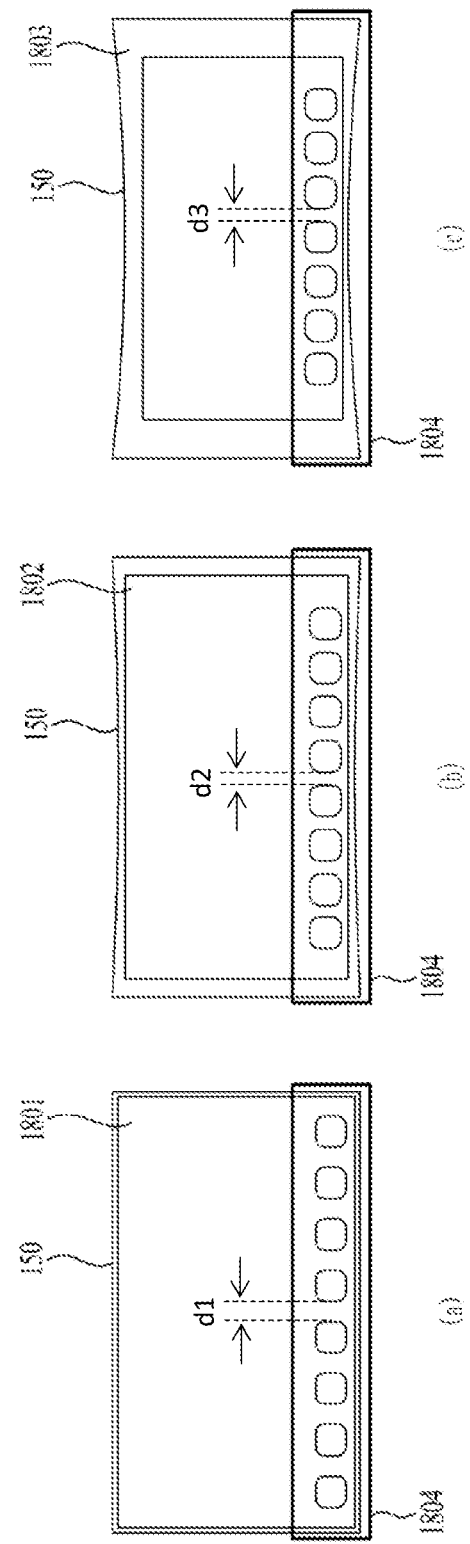
FIG. 18 is a diagram illustrating a method for adjusting arrangement, spacing, and size of a user interface in response to a curvature of a display device according to an embodiment of the present disclosure.

FIG. 18 is a diagram illustrating a method for adjusting arrangement, spacing, and size of a user interface in response to a curvature of a display device according to an embodiment of the present disclosure. Hereinafter, descriptions overlapping with the above description will herein be omitted for brevity.

FIG. 18(a) is a view illustrating a state in which the display module 150 is in the flat mode, and FIG. 18(b) is a view illustrating a state in which the display module 150 is in the first bending mode, and FIG. 18(c) is a view illustrating a state in which the display module 150 is in the second bending mode.

FIG. 18 is a diagram illustrating an example of outputting a user interface 1804 to the above-described display region shown in FIG. 16. The user interface 1804 shown in FIG. 18 may correspond to a menu that is output at a lower end of the screen. In particular, the user interface 1804 may include a plurality of items.

Referring to FIG. 18(a), when the display module 150 is in the flat mode, the display device 100 may enable a plurality of items included in the user interface 1804 to be output at the lower end of the first region 1801 at intervals of a first spacing (d1).

Referring to FIG. 18(b), when the display module 150 is in the first bending mode, the display device 100 may enable a plurality of items included in the user interface 1804 to be output at the lower end of the second region 18701 at intervals of a second spacing (d2). At this time, the second region 1802 smaller in size than the first region 1801 may be disposed at the center of the display module 150. In addition, the second spacing (d2) is smaller than the first spacing (d1).

Finally, referring to FIG. 18(c), when the display module 150 is in the second bending mode, the display device 100 may enable a plurality of items included in the user interface 1804 to be output at the lower end of the third region 1803 at intervals of a third spacing (d3). At this time, the third region 1803 relatively smaller in size than the second region 1802 may be disposed at the center of the display module 150. In addition, the third spacing (d3) may be smaller than the second spacing (d2).

That is, as the display region becomes smaller in size, the display device 100 may reduce not only the sizes of the plurality of items included in the user interface 1804 being output to the display region, but also the spacing between the items.

In one embodiment of the present disclosure, in a situation in which the display module 150 is in the first bending mode or the second bending mode, when the display module 150 outputs a plurality of items included in the user interface 1804 at the lower end of the second region 1802 or the third region 1803, the plurality of items can be output in a centralized format. This is because, when the plurality of items is arranged in a centralized format based on the viewing angle of the screen, the user can better view the menu item. Similarly, the display device 100 may output the plurality of items in a fan-shaped format, which will be described later with reference to FIG. 19.

In one embodiment of the present disclosure, as the display module 150 transitions from the flat mode (see FIG. 18a) to the second bending mode (see FIG. 18c), the display device 100 may enable each of the items included in the user interface 1804 to be output with a smaller size.

Accordingly, since the field of view (FOV) of the screen decreases in proportion to the increasing curvature of the display module 150, the spacing between the user interfaces 1804 is reduced and the size of each user interface 1804 decreases, so that the user can easily use the user interfaces 1804 at a glance.

Figure 19:
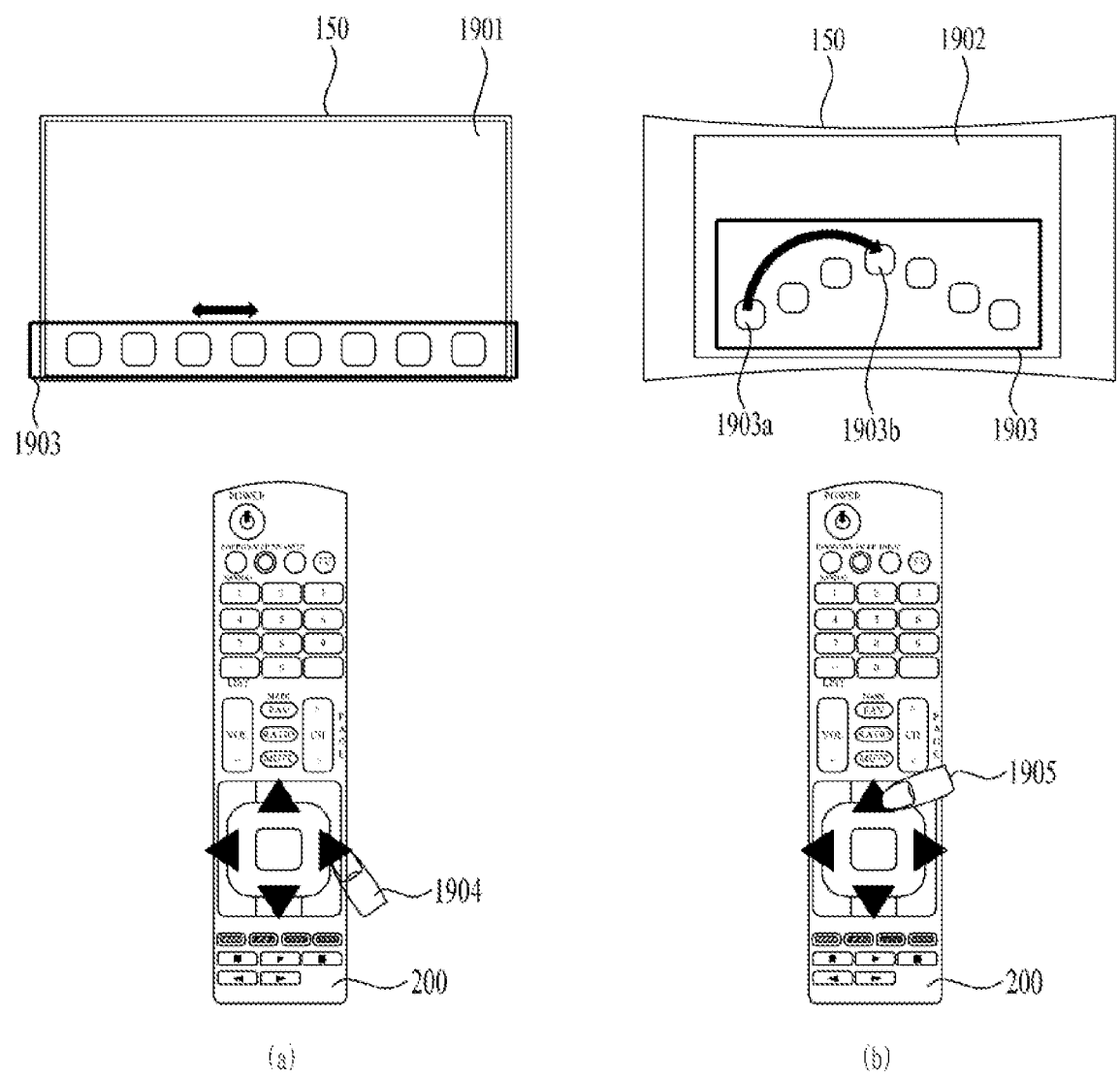
FIG. 19 is a diagram illustrating a method for adjusting arrangement and shape of a user interface in response to a curvature of a display device according to an embodiment of the present disclosure.

FIG. 19 is a diagram illustrating a method for adjusting arrangement and shape of a user interface in response to a curvature of a display device according to an embodiment of the present disclosure. Hereinafter, descriptions overlapping with the above description will herein be omitted for brevity.

FIG. 19(a) is a view illustrating a state in which the display module 150 is in the flat mode, and FIG. 19(c) is a view illustrating a state in which the display module 150 is in the second bending mode. Although the first bending mode is not shown in FIG. 19 for convenience of description, it should be noted that the following embodiments can also be applied to the first bending mode without departing from the scope or spirit of the present disclosure.

FIG. 19 is a view illustrating an example of outputting the user interface 1902 to the display region described above in FIG. 16. The user interface 1903 shown in FIG. 19 may correspond to the menu being output to the lower end of the screen. In particular, the user interface 1903 may include a plurality of items.

Referring to FIG. 19(a), when the display module 150 is in the flat mode, the display device 100 may output a plurality of items included in the user interface 1903 at the lower end of the first region 1901.

On the other hand, referring to FIG. 19(b), when the display module 150 is in the second bending mode, the display device 100 may output the plurality of items included in the user interface 1903 in a fan-shaped format at the lower end of the second region 1902. That is, since the display device 100 outputs the plurality of items included in the user interface 1903 in the fan-shaped format, the user can comfortably view all items within the viewing angle of the screen irrespective of the increasing curvature of the display module 150.

In one embodiment of the present disclosure, the display device 100 may receive a control signal from the remote controller 200, and a detailed description thereof is the same as described above.

In FIG. 19(a), the display device 100 may receive a control signal 1904 for selecting the left/right buttons from the remote controller 200. In this case, the display device 100 may horizontally select a plurality of items included in the user interface 1903 upon receiving the control signal 1904 from the remote controller 200.

In contrast, in FIG. 19(b), the display device 100 may receive a control signal 1905 for selecting the UP button from the remote controller 200. In this case, upon receiving the control signal 1905 from the remote controller 200, the display device 100 may select the most central item 1903b from among the plurality of items included in the user interface 1903.

In more detail, the display device 100 may select the first item 1903a included in the user interface 1903 based on the control signal of the remote controller 200. At this time, when the display device 100 receives the control signal 1905 for selecting the UP button from the remote controller 200, the display device 100 may select the second item 1903b from among the plurality of items included in the user interface 1903 arranged in the fan-shaped format. In this case, the second item 1903b is disposed at the most central item from among the plurality of items or is disposed at the uppermost item from among the plurality of items.

That is, as shown in the embodiment of FIG. 19, when the plurality of items included in the user interface 1903 is arranged in a fan-shaped format, the display device may receive the control signal 1905 selecting the UP button from the remote controller 200. At this time, since the plurality of items in the user interface 1903 is arranged in the fan-shaped format, it can be expected that the user can select an item even when the left/right buttons and the UP button are selected. Accordingly, when the display device 100 receives the control signal 1905 selecting the UP button from the remote controller 200, the display device 100 may control the second item 193b to be selected according to the user's expectation.

In addition, although the remote controller 1905 shown in FIG. 19 has been described by taking the remote control as an example, the scope or spirit of the present disclosure is not limited thereto, and it should be noted that the remote controller 1905 can also include a jog shuttle or joystick including the up, down, left, and right buttons as necessary.

Figure 20:
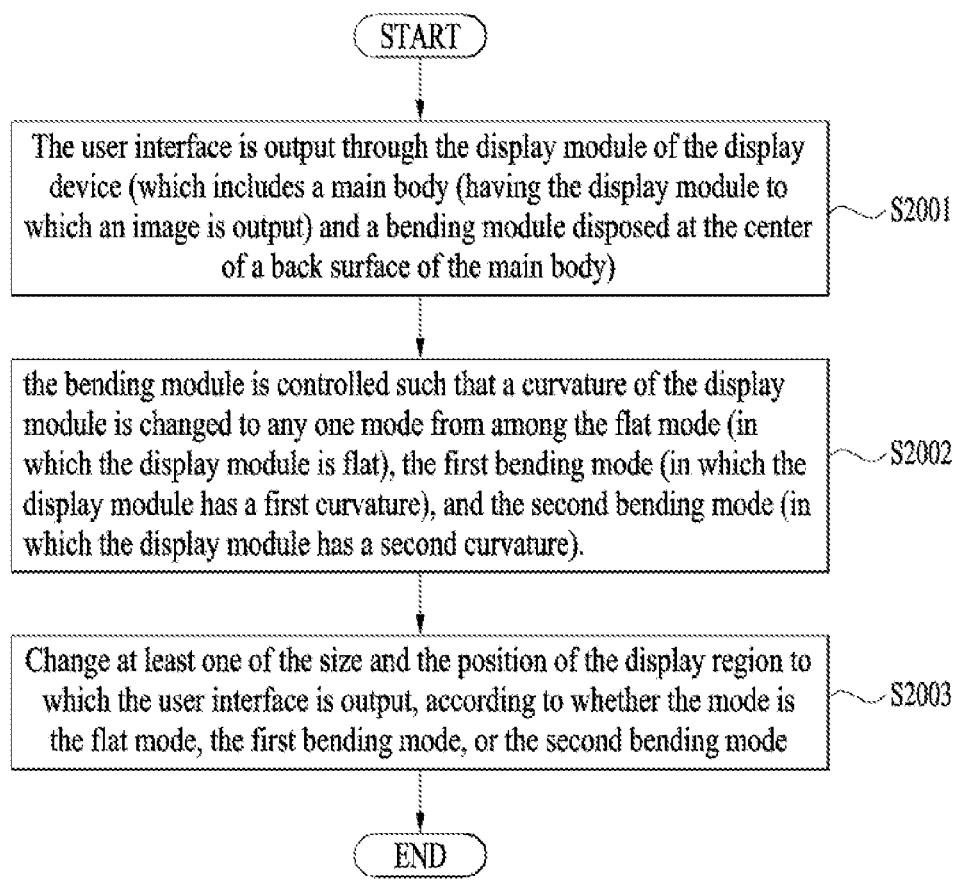
FIG. 20 is a flowchart illustrating a method for outputting a user interface differently in response to a curvature of a display device according to an embodiment of the present disclosure.

FIG. 20 is a flowchart illustrating a method for outputting a user interface differently in response to a curvature of a display device according to an embodiment of the present disclosure. Hereinafter, descriptions overlapping with the above description will herein be omitted for brevity.

Referring to FIG. 20, in step S2001, the display device including not only a main body including the display module through which the image is output, but also a bending module disposed at the center of a back surface of the main body may output the user interface through the display module.

In step S2002, the display device may control the bending module to change a curvature of the display module to any one of the flat mode in which the display module is flat, the first bending mode in which the display module has a first curvature, and a second bending mode in which the display module has a second curvature. The second curvature may be a maximum curvature of the display module.

In step S2003, the display device may change at least one of the size and the position of the display region to which the user interface is being output according to whether the operation mode is the flat mode, the first bending mode, or the second bending mode.

In one embodiment of the present disclosure, the display device may output the user interface to the first region of the display module when the display module is in the flat mode. The display device may output the user interface to the second region of the display module when the display module is in the second bending mode. In this case, the second region may be smaller in size than the first region. Further, the display device may adjust the size of the user interface based on the sizes of the first region and the second region.

In one embodiment of the present disclosure, when the user interface includes a plurality of items, the display device may control the plurality of items to be displayed on the first region at intervals of the first spacing. In addition, the display device may allow the plurality of items to be displayed on the second region at intervals of the second spacing. In this case, the second spacing may be smaller in width than the first spacing. In addition, when the display device outputs the plurality of items to the second region, the display device may allow the plurality of items to be arranged in the centralized format or the fan-shaped format.

In one embodiment of the present disclosure, the display device may receive a control signal from the remote controller. The display device may select the first item from among the plurality of items based on the control signal received from the remote controller. In addition, upon receiving a control signal for selecting the UP button from the remote controller, the display device may select the most central item or the uppermost item from among the plurality of items arranged in the fan-shaped format.

In addition, the embodiments described above in FIGS. 9 to 19 can also be performed by the method of controlling the display device as shown in FIG. 20.

The present disclosure may be implemented as code that can be written to a computer-readable recording medium and can thus be read by a computer. The computer-readable recording medium may be any type of recording device in which data can be stored in a computer-readable manner.

Examples of the computer-readable recording medium include a hard disk drive (HDD), a solid state drive (SSD), a silicon disk drive (SDD), a ROM, a RAM, a CD-ROM, a magnetic tape, a floppy disk, optical data storage, and a carrier wave (e.g., data transmission over the Internet). In addition, the computer may include the controller. The above exemplary embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein.

As is apparent from the above description, the display device according to the embodiments of the present disclosure can enable a display module to be transformed into a flat mode or a bending mode, so that the user can easily use the display module implemented as a user desired format.

The user who views the display device according to the embodiments of the present disclosure can use a user interface suitable for his or her field of view (FOV) according to a change in curvature of the display module.

It will be apparent to those skilled in the art that various modifications and variations can be made in the present disclosure without departing from the spirit or scope of the inventions. Thus, it is intended that the present disclosure covers the modifications and variations of this invention provided they come within the scope of the appended claims and their equivalents.

What is claimed is:

1. A display device comprising:
a main body configured to have a display module to which a user interface is output;
a bending module located at a center of a back surface of the main body; and
a controller,
wherein
the controller is configured to:
control the bending module to change a curvature of the display module to any one of a flat mode in which the display module is flat, a first bending mode in which the display module has a first curvature, or a second bending mode in which the display module has a second curvature, wherein the second curvature is a maximum curvature of the display module, and
change at least one of a size or a position of a display region to which the user interface is output, according to whether the curvature of the display module is in the flat mode, the first bending mode, or the second bending mode, and
wherein:
based on the curvature of the display module being in the flat mode, the controller outputs the user interface to a first region of the display module;
based on the curvature of the display module being in the second bending mode, the controller outputs the user interface to a second region of the display module that is smaller in size than the first region;
the user interface includes a plurality of items;
the controller is further configured to:
output the plurality of items spaced apart from each other by a first spacing to the first region in the flat mode;
output the plurality of items spaced apart from each other by a second spacing to the second region in the first bending mode; and
output the plurality of items spaced apart from each other by a third spacing to a third region of the display module in the second bending mode, the third region being smaller in size than the second region; and
the second spacing is smaller in distance than the first spacing, and the third spacing is smaller in distance than the second spacing.

2. The display device according to claim 1, wherein:
the controller is further configured to adjust a size of the user interface based on sizes of the first region and the second region.

3. The display device according to claim 1, wherein:
when the plurality of items is output to the second region, the controller enables the plurality of items to be output in a centralized arrangement format.

4. The display device according to claim 1, wherein:
when the plurality of items is output to the second region, the controller enables the plurality of items to be output in a fan-shaped arrangement format.

5. The display device according to claim 4, wherein the controller is further configured to:
receive a second control signal from a remote controller; and
select a first item from among the plurality of items based on the received second control signal.

6. The display device according to claim 5, wherein the controller is further configured to:
upon receiving a selection signal for selecting an UP button from the remote controller, select a second item from among the plurality of items arranged in the fan-shaped arrangement format,
wherein the second item is located at a most central position or an uppermost position of the fan-shaped arrangement format.

7. The display device according to claim 1, further comprising:
one pair of links having one end coupled to the bending module, and extending in a horizontal direction; and
a link bracket disposed at left and right ends of the main body and connected to the other end of the links,
wherein the bending module includes:
a guide shaft extending from the back surface of the main body; and
a movable block inserted into the guide shaft and configured to move forward and backward,
wherein, when the movable block moves forward and backward along the guide shaft, an angle between the links is changed and the curvature of the display module is also changed.

8. The display device according to claim 1, wherein the first curvature value is settable by the user in units of 100R.

9. The display device according to claim 1, wherein the controller is further configured to:
receive a control signal from a remote controller operable by a user; and
based on the received control signal, control the bending module to change the curvature of the display module to a first curvature value that is set by the user and that is different from all preset curvature values.

10. A method for controlling a display device which includes a main body having a display module to which an image is output, and a bending module located at a center of a back surface of the main body, the method comprising:
outputting a user interface image through the display module of the display device;
controlling the bending module to change a curvature of the display module to any one of a flat mode in which the display module is flat, a first bending mode in which the display module has a first curvature, or a second bending mode in which the display module has a second curvature, wherein the second curvature is a maximum curvature of the display module; and changing at least one of a size or a position of a display region to which the user interface is output, according to whether the curvature of the display module is in the flat mode, the first bending mode, or the second bending mode, wherein:

based on the curvature of the display module being in the flat mode, the controller outputs the user interface image to a first region of the display module;

based on the curvature of the display module being in the second bending mode, the controller outputs the user interface image to a second region of the display module that is smaller in size than the first region;

the user interface includes a plurality of items;

the method further comprises:

outputting the plurality of items spaced apart from each other by a first spacing to the first region in the flat mode;

outputting the plurality of items spaced apart from each other by a second spacing to the second region in the first bending mode; and outputting the plurality of items spaced apart from each other by a third spacing to a third region of the display module in the second bending mode, the third region being smaller in size than the second region; and the second spacing is smaller in distance than the first spacing, and the third spacing is smaller in distance than the second spacing.

* * * * *